United States Patent
Wu et al.

(10) Patent No.: US 12,069,455 B2
(45) Date of Patent: Aug. 20, 2024

(54) PROCESS OF FABRICATING LATERAL MODE CAPACITIVE MICROPHONE INCLUDING A CAPACITOR PLATE WITH SANDWICH STRUCTURE

(71) Applicant: GMEMS TECH SHENZHEN LIMITED, Shenzhen (CN)

(72) Inventors: Guanghua Wu, Dublin, CA (US); Xingshuo Lan, San Jose, CA (US)

(73) Assignee: GMEMS TECH SHENZHEN LIMITED, Shenzhen (CN)

( * ) Notice: Subject to any disclaimer, the term of this patent is extended or adjusted under 35 U.S.C. 154(b) by 550 days.

(21) Appl. No.: 17/304,373

(22) Filed: Jun. 19, 2021

(65) Prior Publication Data

US 2021/0314718 A1    Oct. 7, 2021

Related U.S. Application Data

(63) Continuation-in-part of application No. 16/885,271, filed on May 28, 2020, now Pat. No. 11,601,763, which is a continuation-in-part of application No. 15/730,732, filed on Oct. 12, 2017, now Pat. No. 10,798,508, which is a continuation-in-part of application No. 15/623,339, filed on Jun. 14, 2017, now Pat. No. 10,244,330, which is a continuation-in-part of application No. 15/393,831, filed on Dec. 29, 2016, now Pat. No. 10,171,917.

(51) Int. Cl.
*H04R 31/00* (2006.01)
*B81B 7/02* (2006.01)
*B81C 1/00* (2006.01)
*H04R 19/04* (2006.01)

(52) U.S. Cl.
CPC ............... *H04R 31/00* (2013.01); *B81B 7/02* (2013.01); *B81C 1/00182* (2013.01); *H04R 19/04* (2013.01); *H04R 2201/003* (2013.01)

(58) Field of Classification Search
CPC .. H04R 31/00; H04R 19/04; H04R 2201/003; H04R 19/005; H04R 2410/03; B81B 7/02; B81C 1/00182
See application file for complete search history.

(56) References Cited

U.S. PATENT DOCUMENTS

| | | | | |
|---|---|---|---|---|
| 4,403,163 | A * | 9/1983 | Armerding | H02K 3/40 310/201 |
| 10,273,150 | B2 * | 4/2019 | Sun | H04R 31/00 |
| 2003/0094047 | A1 * | 5/2003 | Torkkeli | G01L 9/0073 73/716 |

(Continued)

*Primary Examiner* — S M Sohel Imtiaz
(74) *Attorney, Agent, or Firm* — George Guosheng Wang; Upstream Research and Patent LLC

(57) ABSTRACT

The present invention provides a process for fabricating a capacitive microphone such as a MEMS microphone. In the microphone, a movable or deflectable membrane/diaphragm may be so fabricated that it moves in a lateral manner relative to a fixed backplate, instead of moving toward/from the fixed backplate. The fixed backplate may be so fabricated that it includes an electrical insulator sandwiched between two sub-conductors to cancel systematic/background noise. The squeeze film damping is substantially avoided, and the performance, such as signal to noise ratio, of the fabricated microphone is significantly improved.

16 Claims, 44 Drawing Sheets

H1 = H10a + H10b + H10c

(56) References Cited

U.S. PATENT DOCUMENTS

| | | | |
|---|---|---|---|
| 2007/0284682 A1* | 12/2007 | Laming | H04R 19/005 |
| | | | 257/E21.526 |
| 2008/0226217 A1* | 9/2008 | Kilic | G01H 9/004 |
| | | | 385/12 |
| 2008/0247573 A1* | 10/2008 | Pedersen | H04R 19/005 |
| | | | 381/174 |
| 2012/0213400 A1* | 8/2012 | Kasai | H04R 19/04 |
| | | | 381/369 |
| 2014/0264662 A1* | 9/2014 | Cheng | B81B 7/02 |
| | | | 257/419 |
| 2015/0274506 A1* | 10/2015 | Feyh | B81C 1/00301 |
| | | | 257/416 |
| 2016/0037266 A1* | 2/2016 | Uchida | H04R 7/06 |
| | | | 381/174 |
| 2016/0130137 A1* | 5/2016 | Huang | B81B 7/02 |
| | | | 438/51 |
| 2016/0167946 A1* | 6/2016 | Jenkins | H04R 19/005 |
| | | | 257/416 |
| 2017/0166437 A1* | 6/2017 | Klein | H04R 19/005 |
| 2017/0265009 A1* | 9/2017 | Sridharan | H04R 7/26 |
| 2018/0086624 A1* | 3/2018 | Cheng | B81B 3/007 |
| 2018/0359571 A1* | 12/2018 | Zhan | B81C 1/00158 |

\* cited by examiner

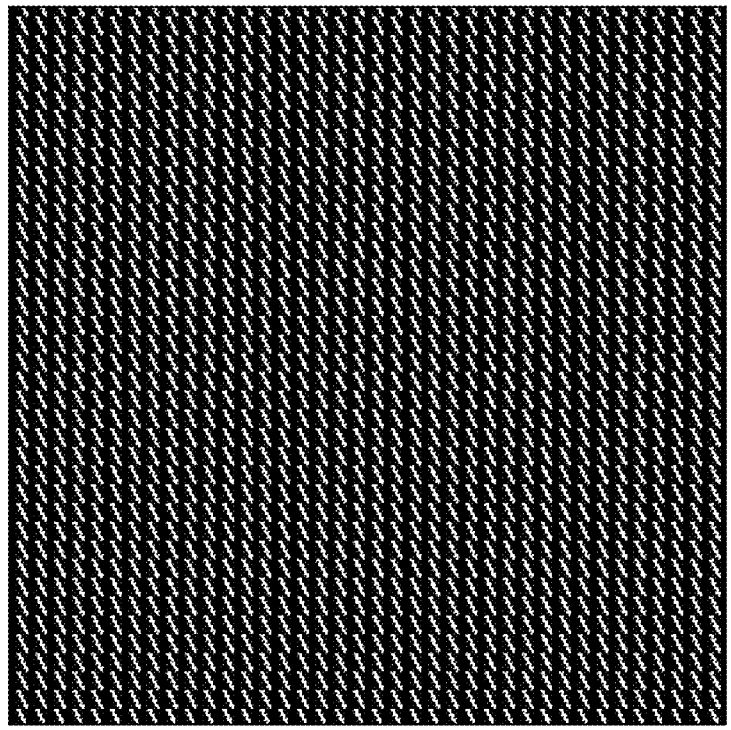
Top View
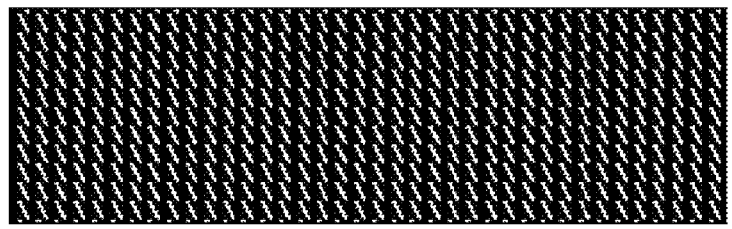
View A-A
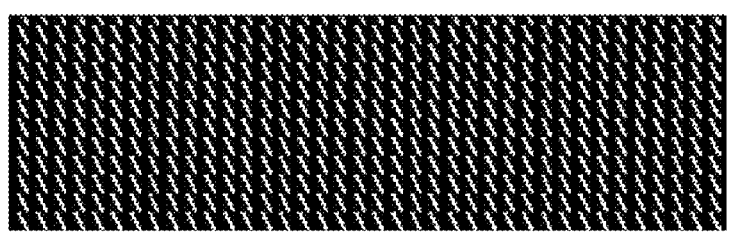
View B-B or C-C
Figure 16 (Step 1)

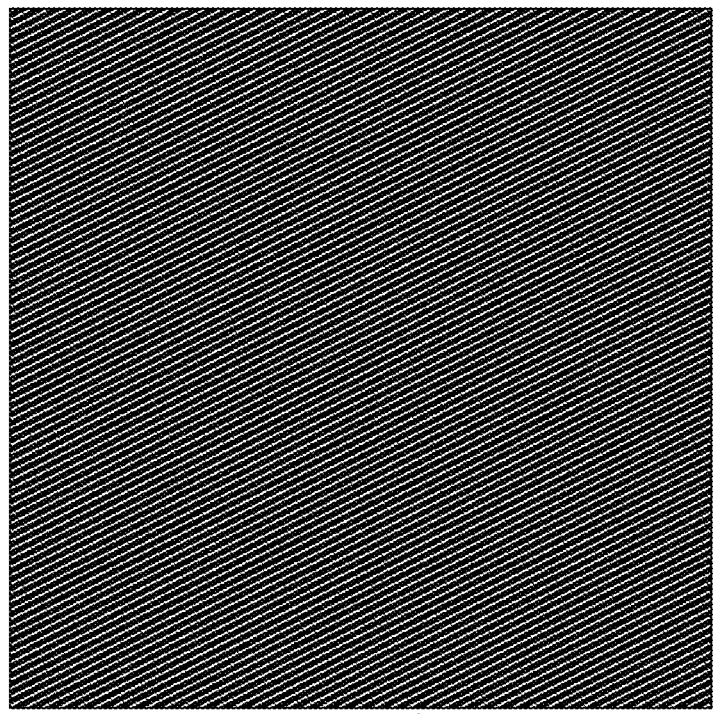
Top View
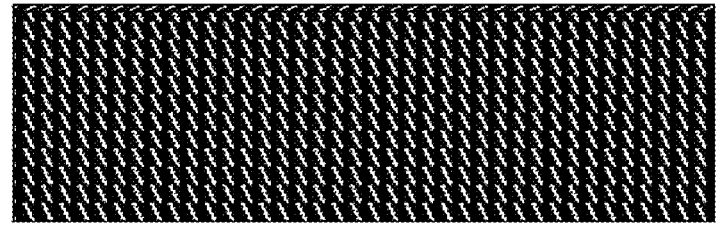
View A-A
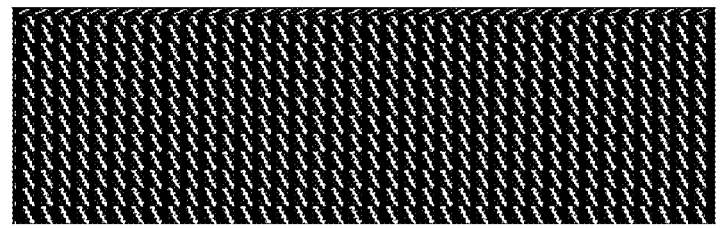
View B-B or C-C
Figure 17 (Step 2)

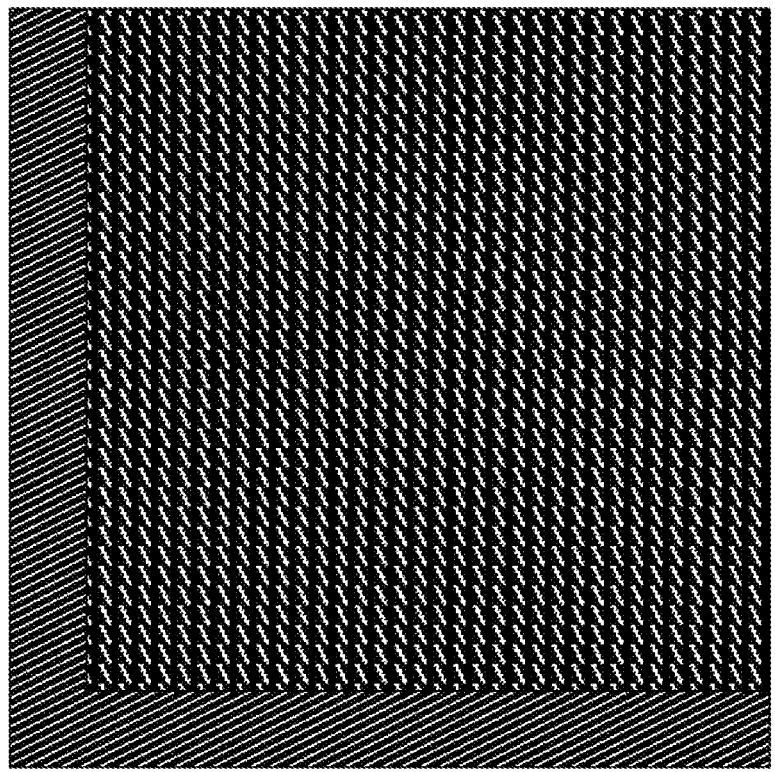
Top View
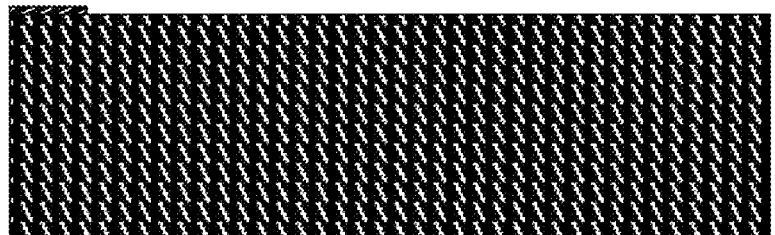
View A-A
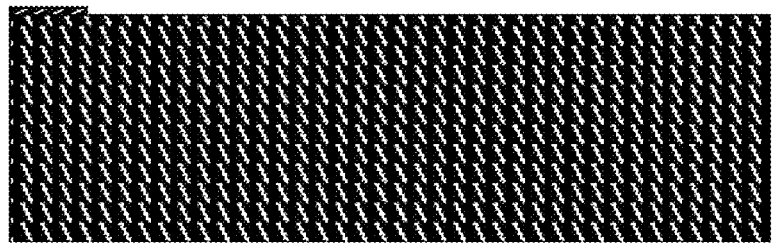
View B-B or C-C
Figure 18 (Step 3)

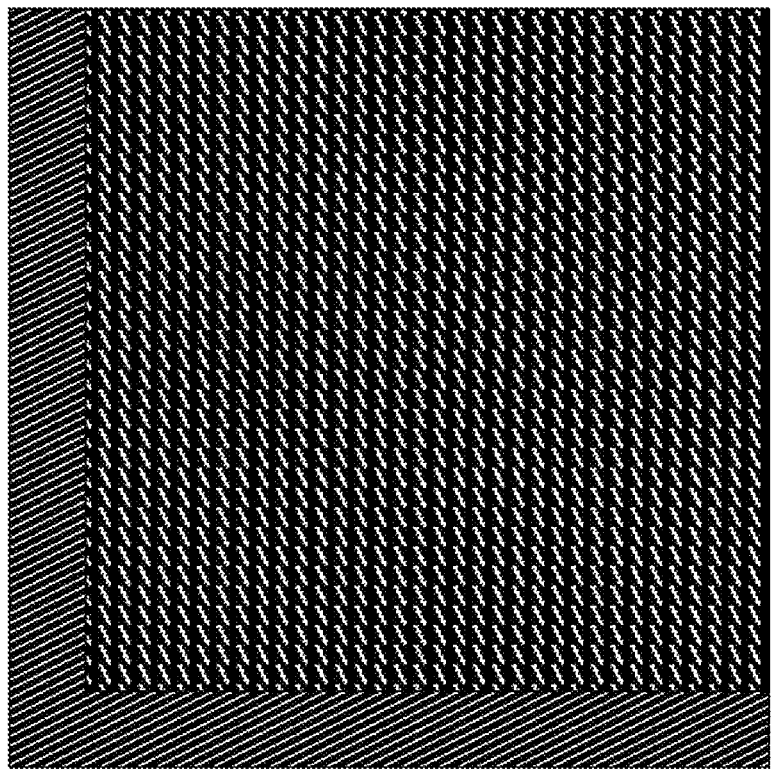
Top View
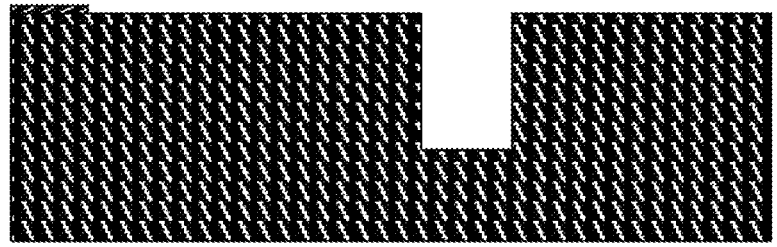
View A-A
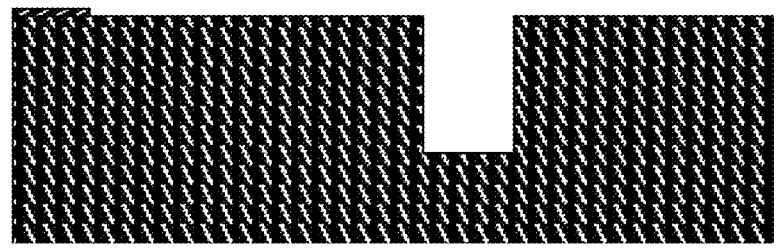
View B-B or C-C
Figure 19 (Step 4)

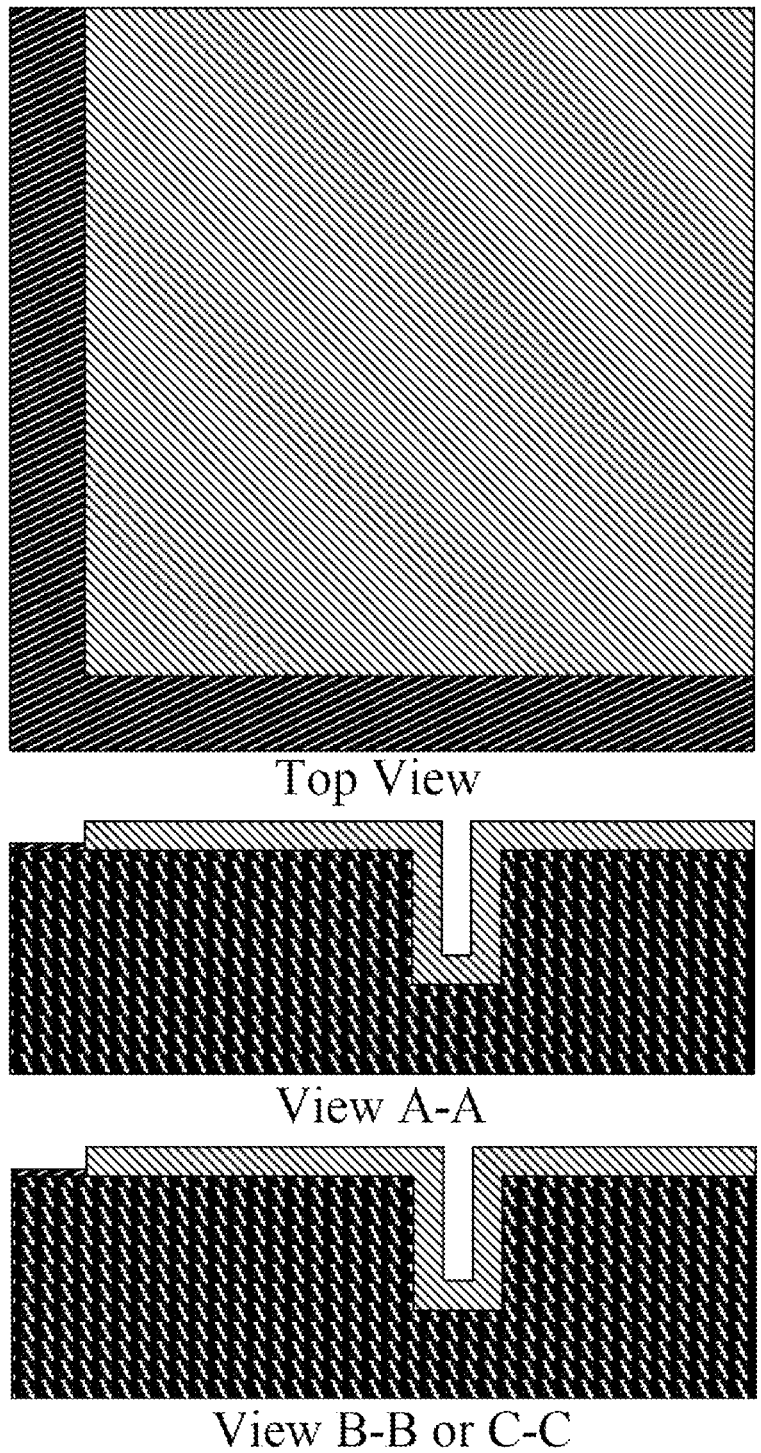
Figure 20 (Step 5)

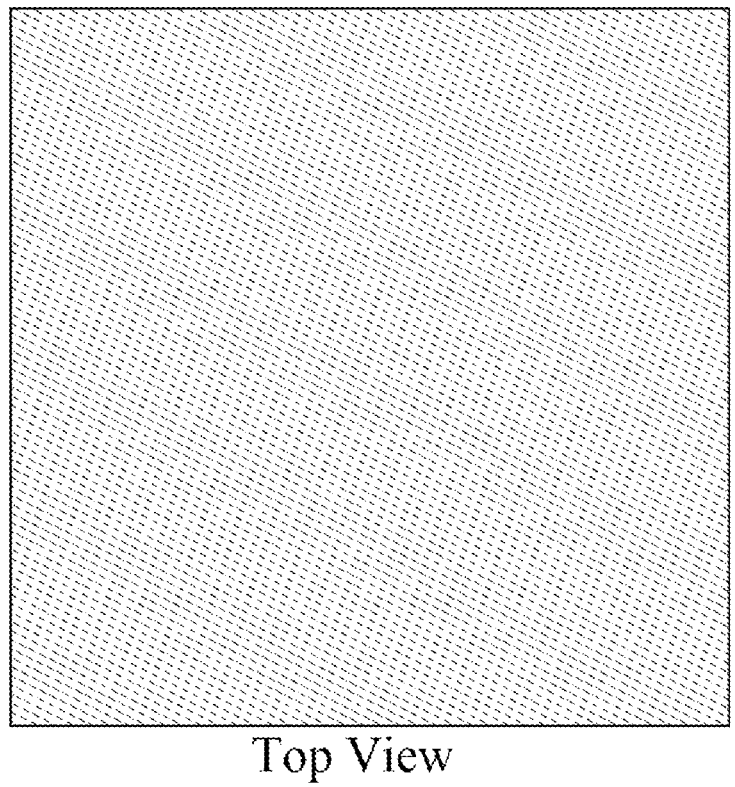
Top View
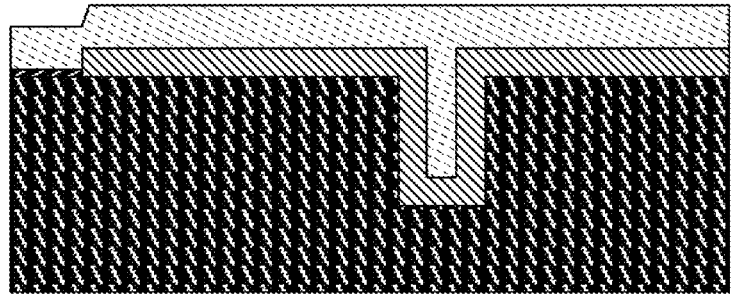
View A-A
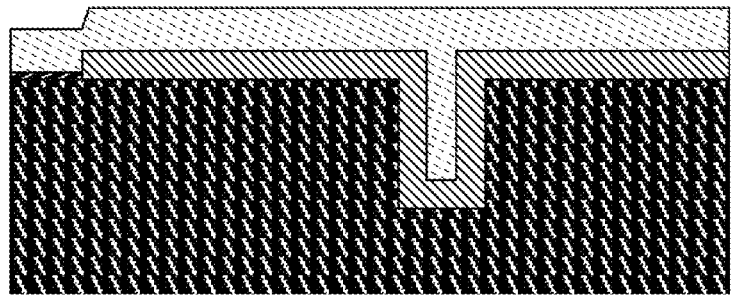
View B-B or C-C
Figure 21 (Step 6)

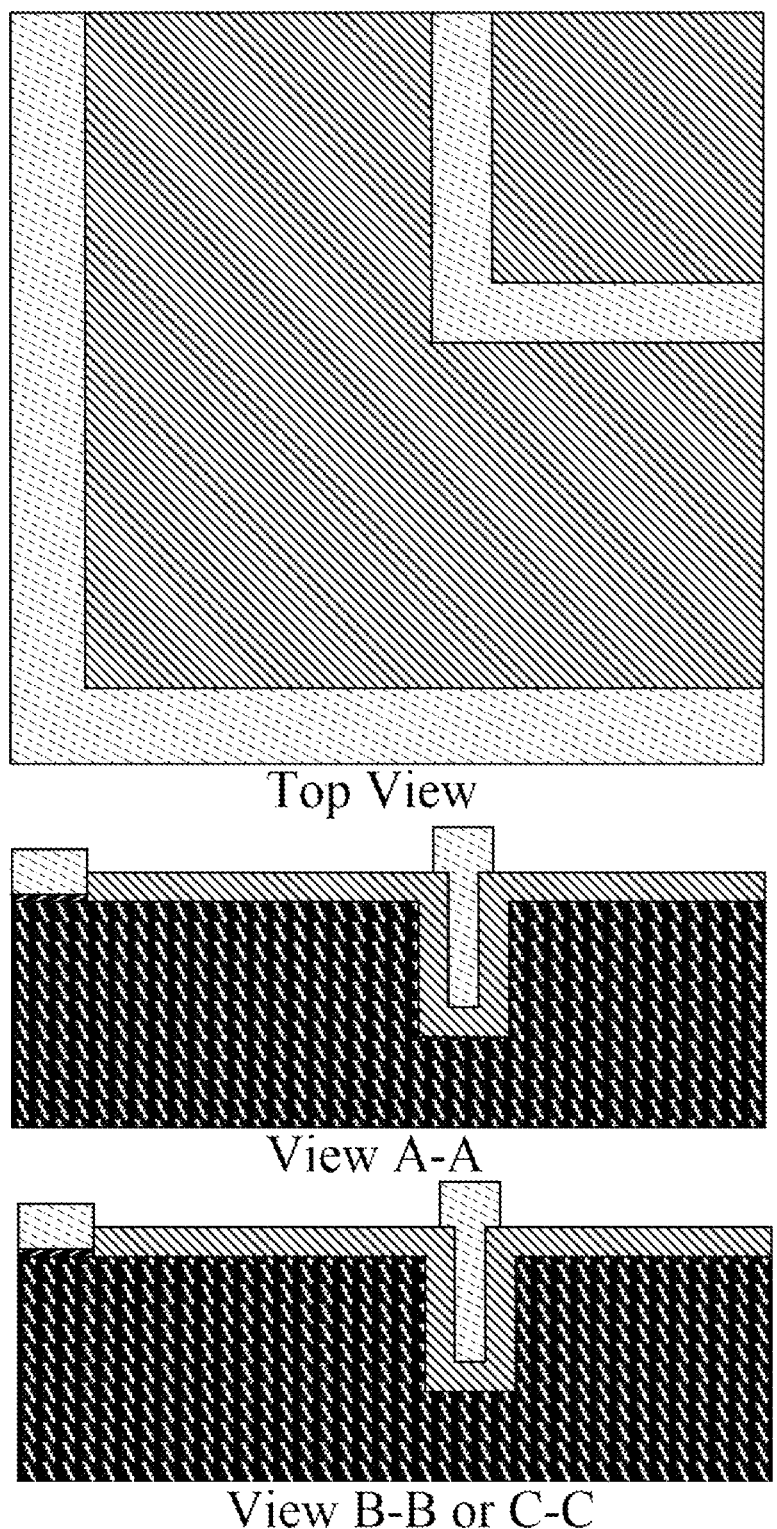
Figure 22 (Step 7)

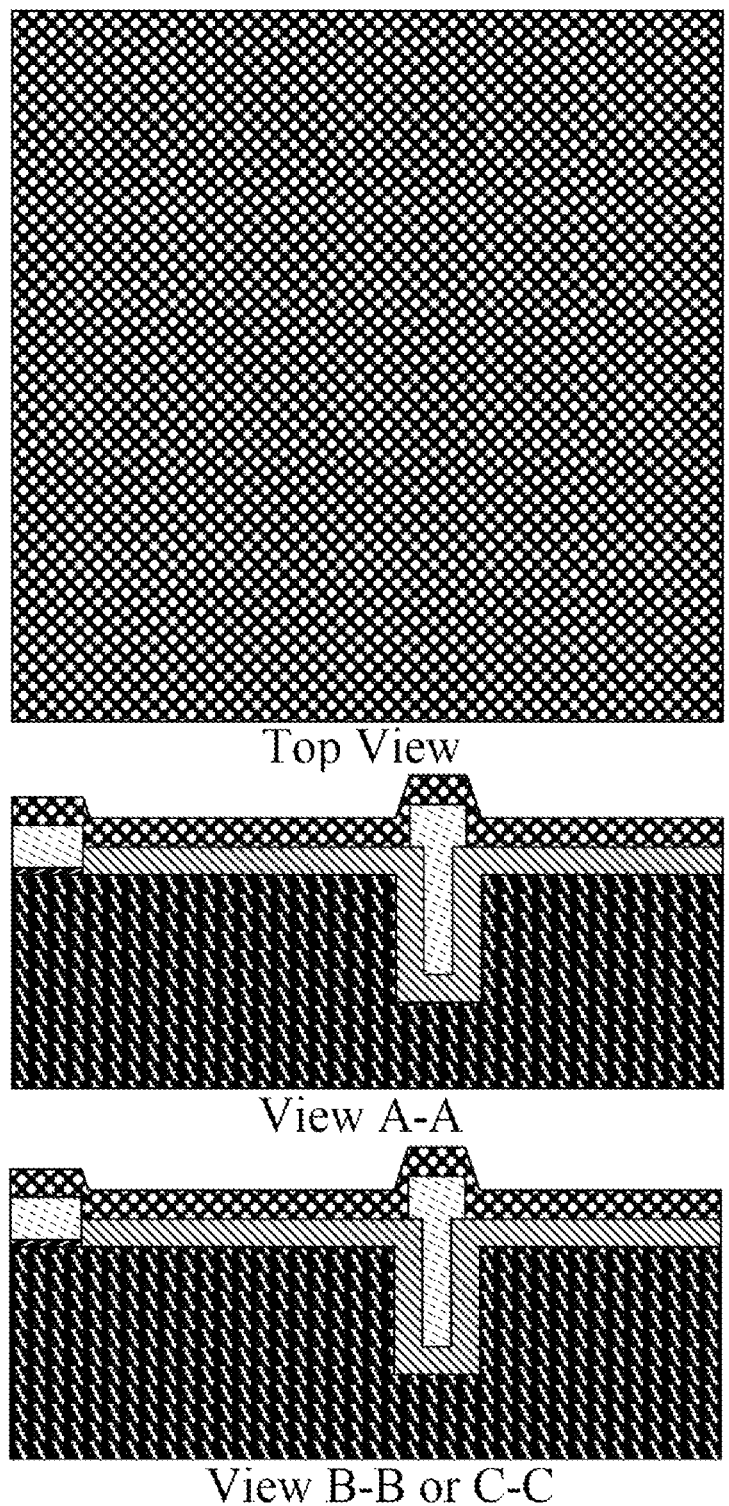
Figure 23 (Step 8)

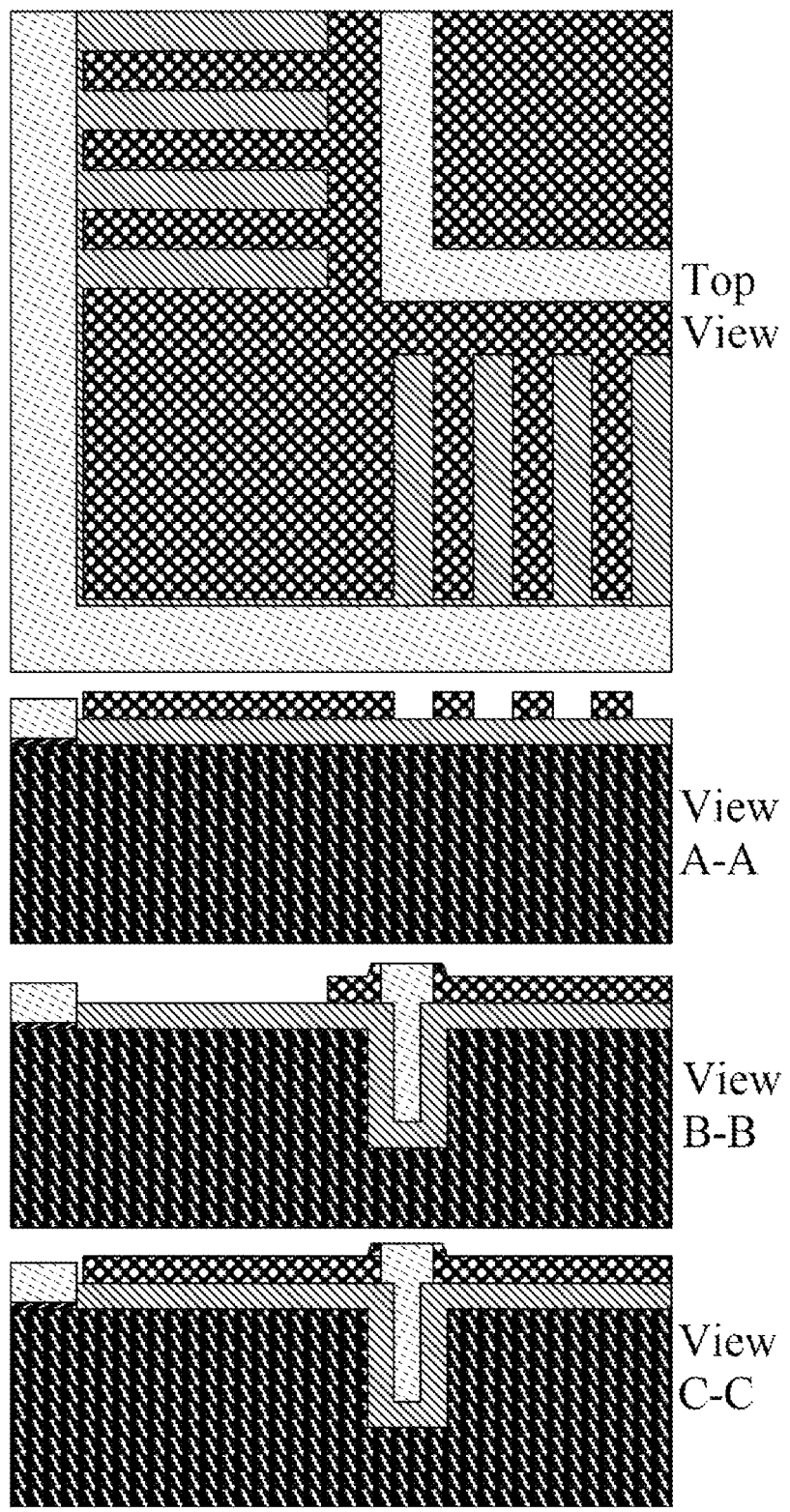
Figure 24 (Step 9)

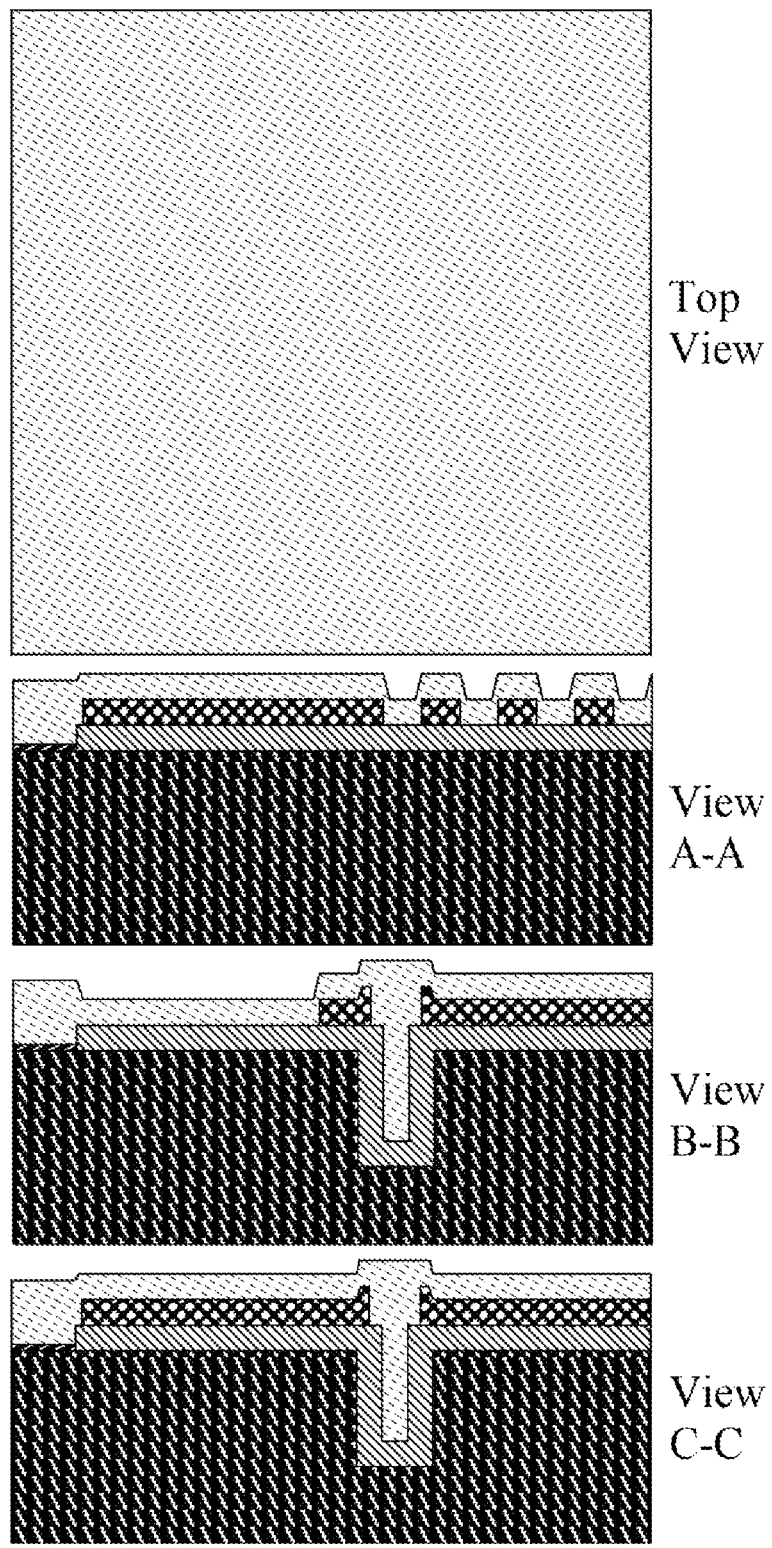
Figure 25 (Step 10)

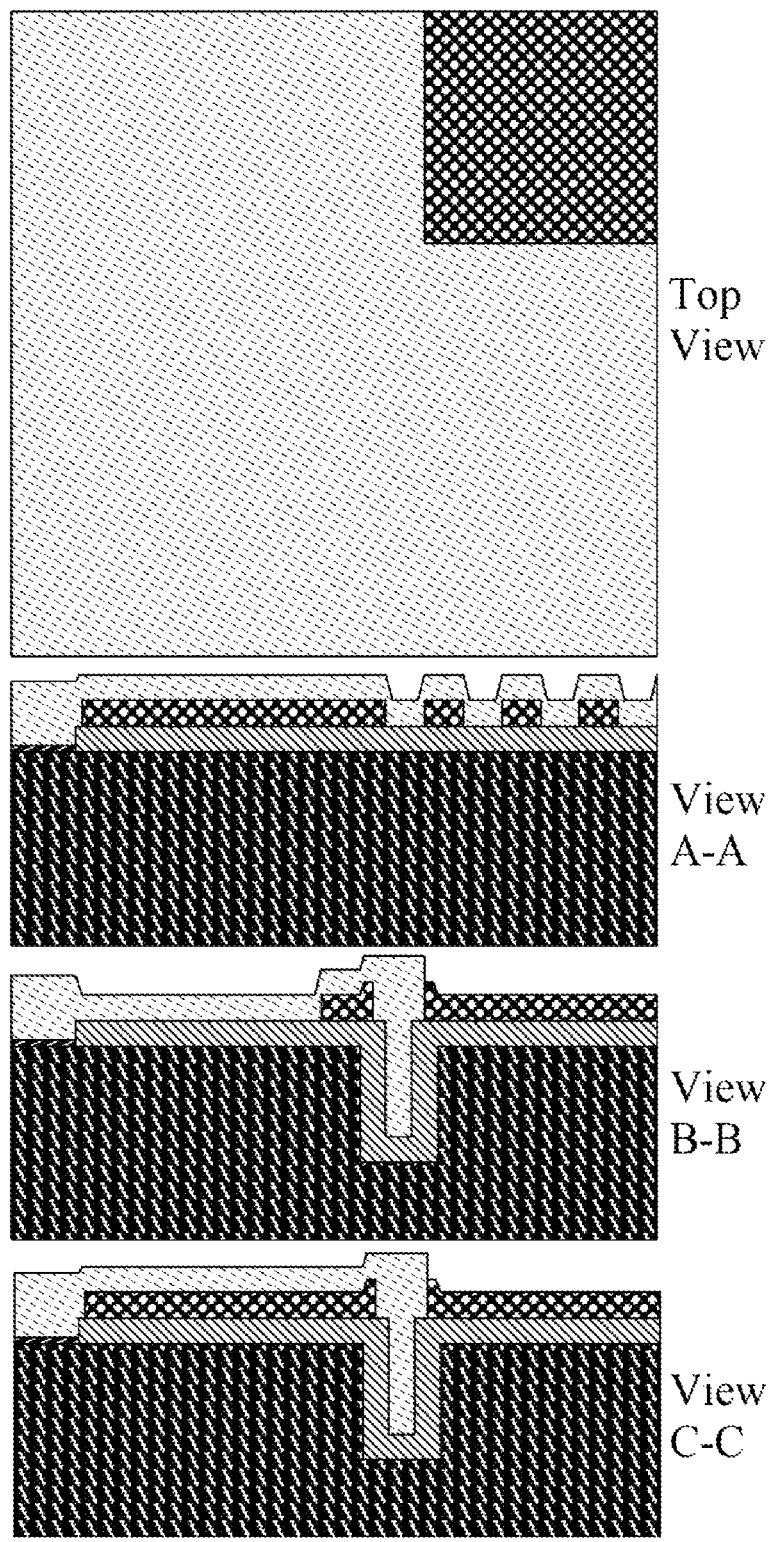
Figure 26 (Step 11)

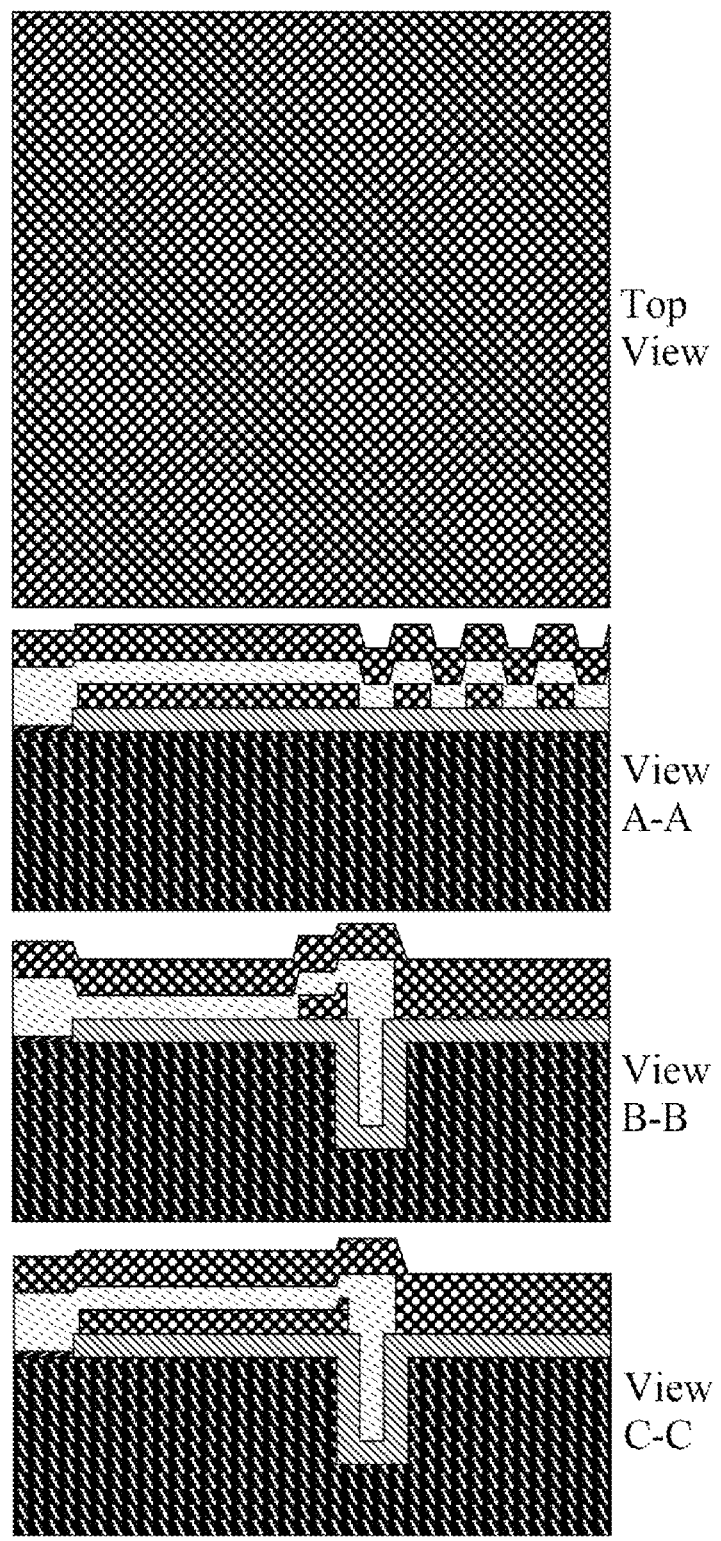
Figure 27 (Step 12)

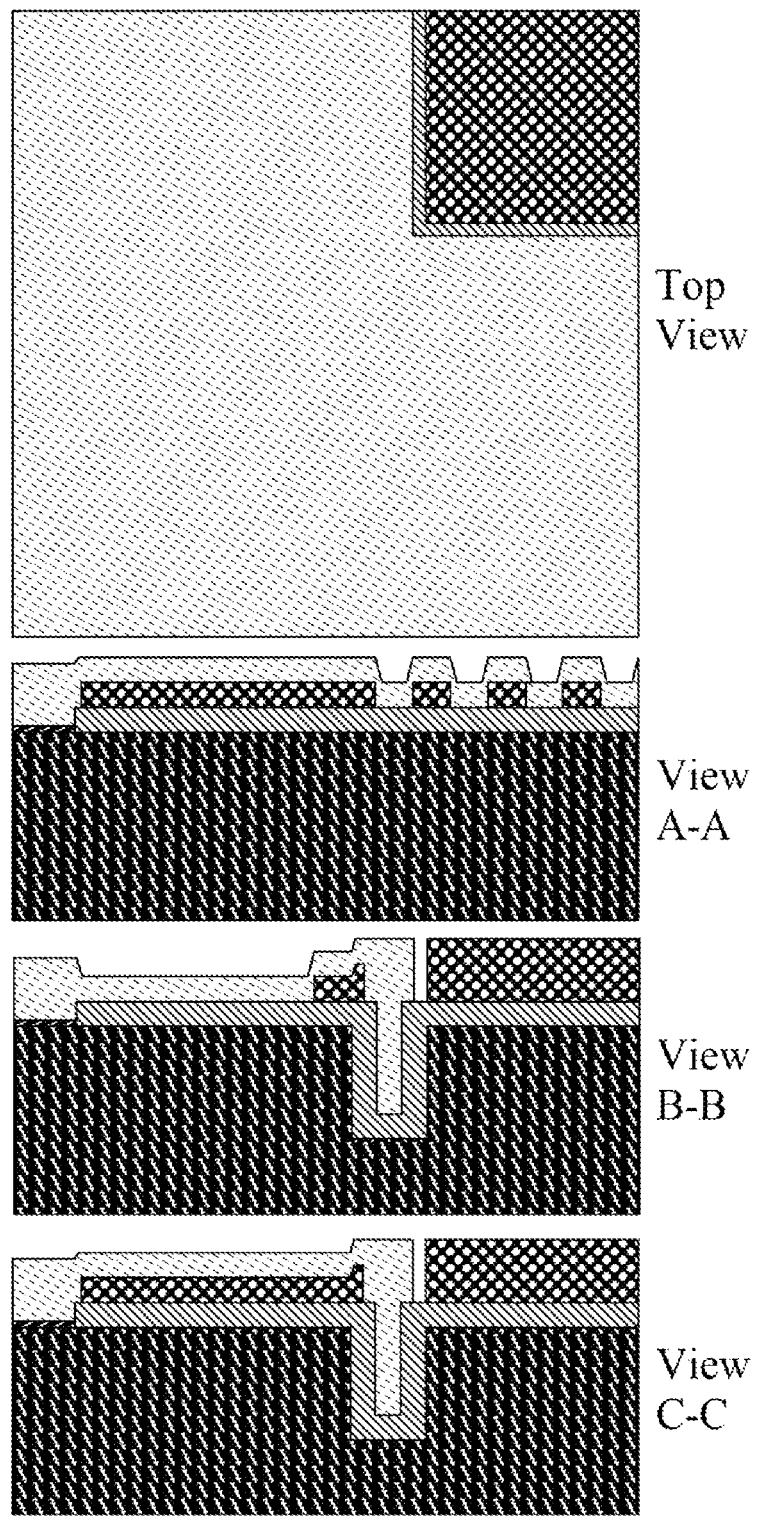
Figure 28 (Step 13)

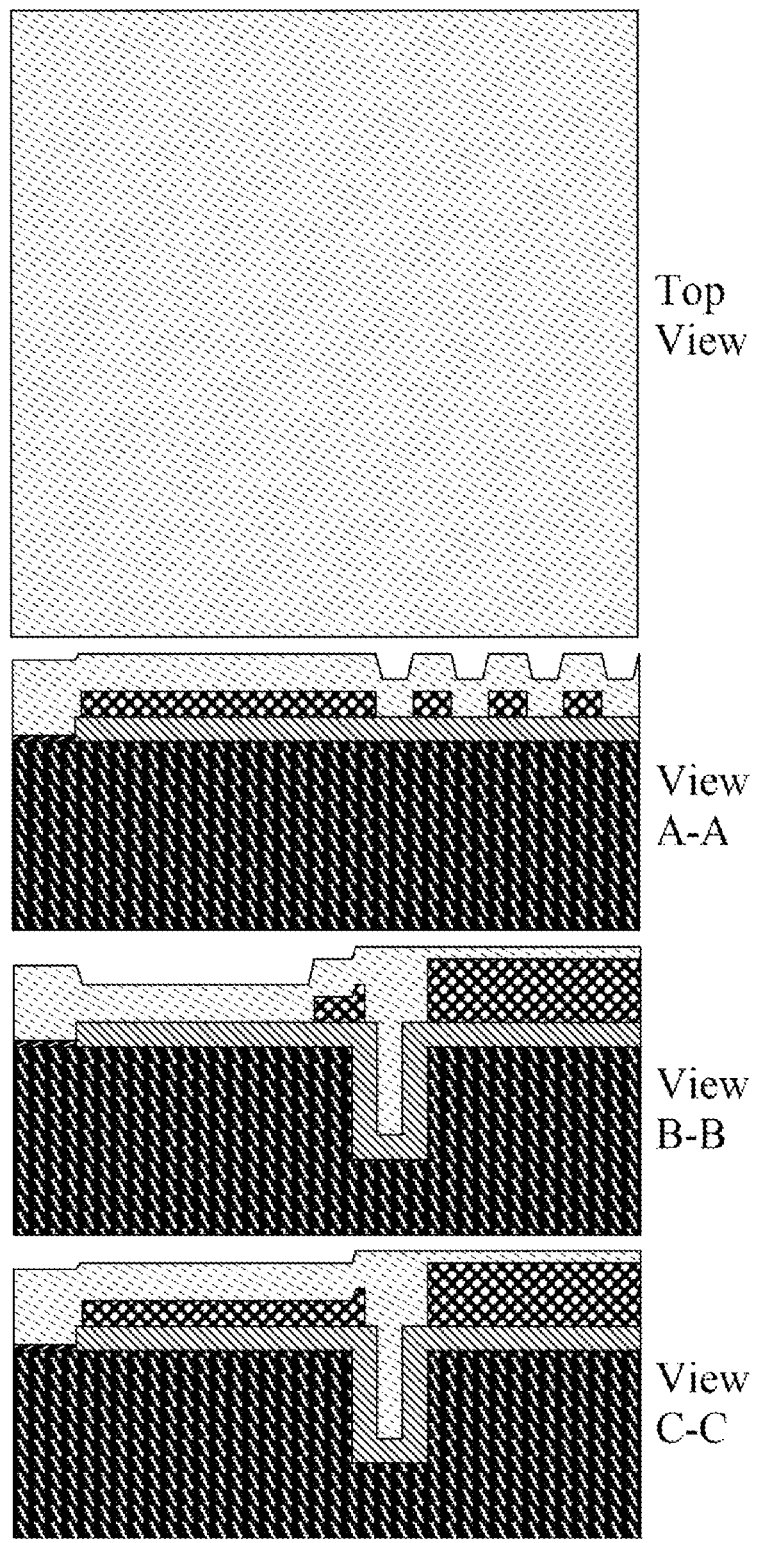
Figure 29 (Step 14)

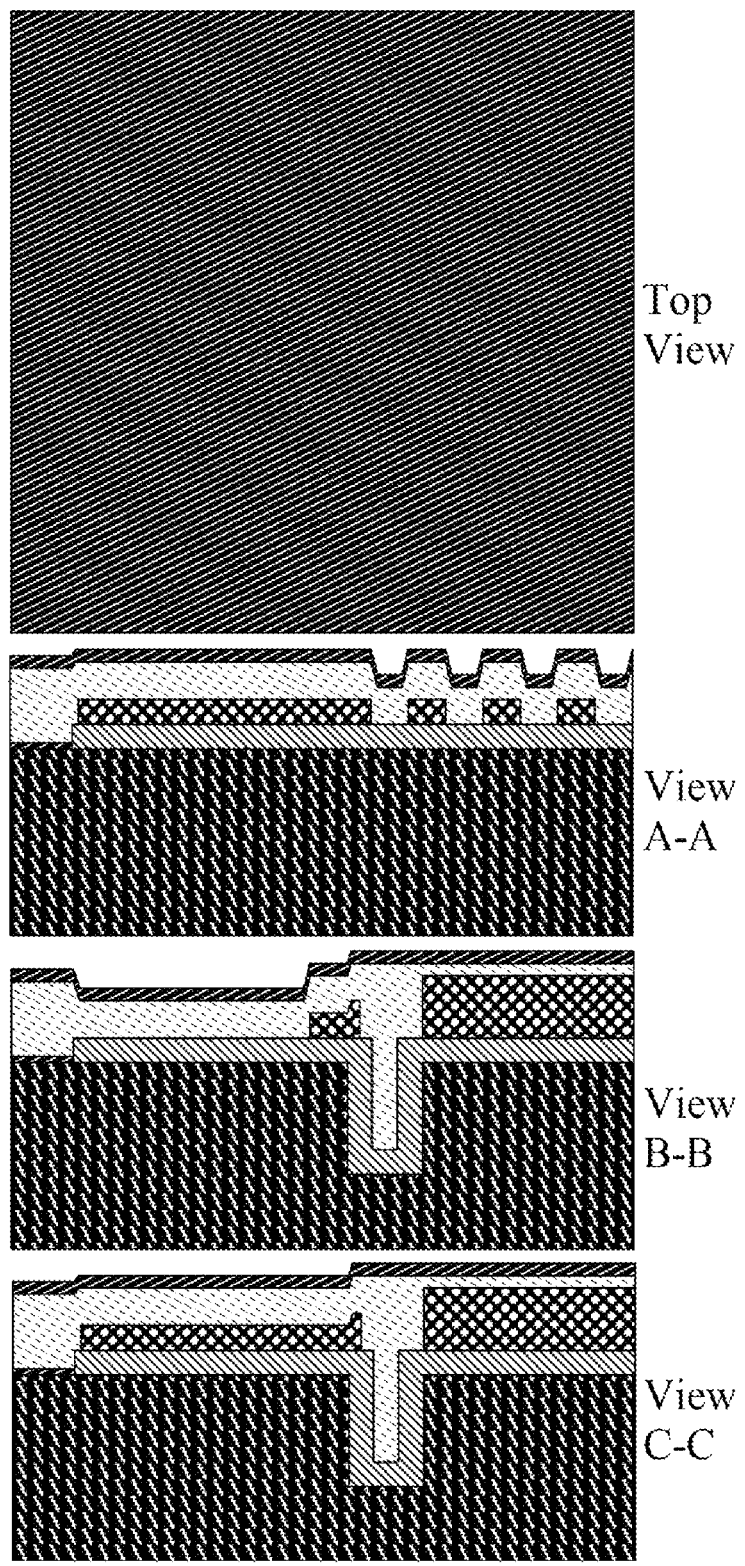
Figure 30 (Step 15)

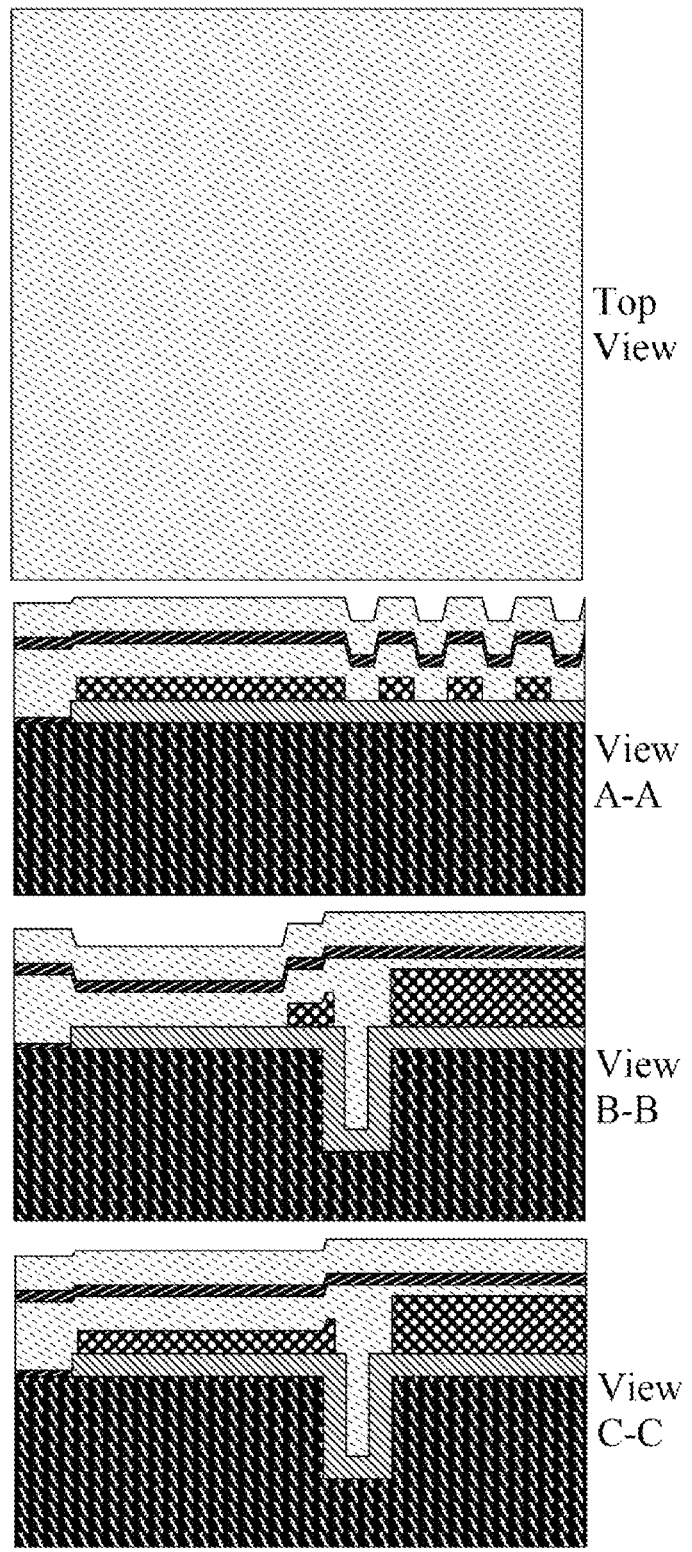
Figure 31 (Step 16)

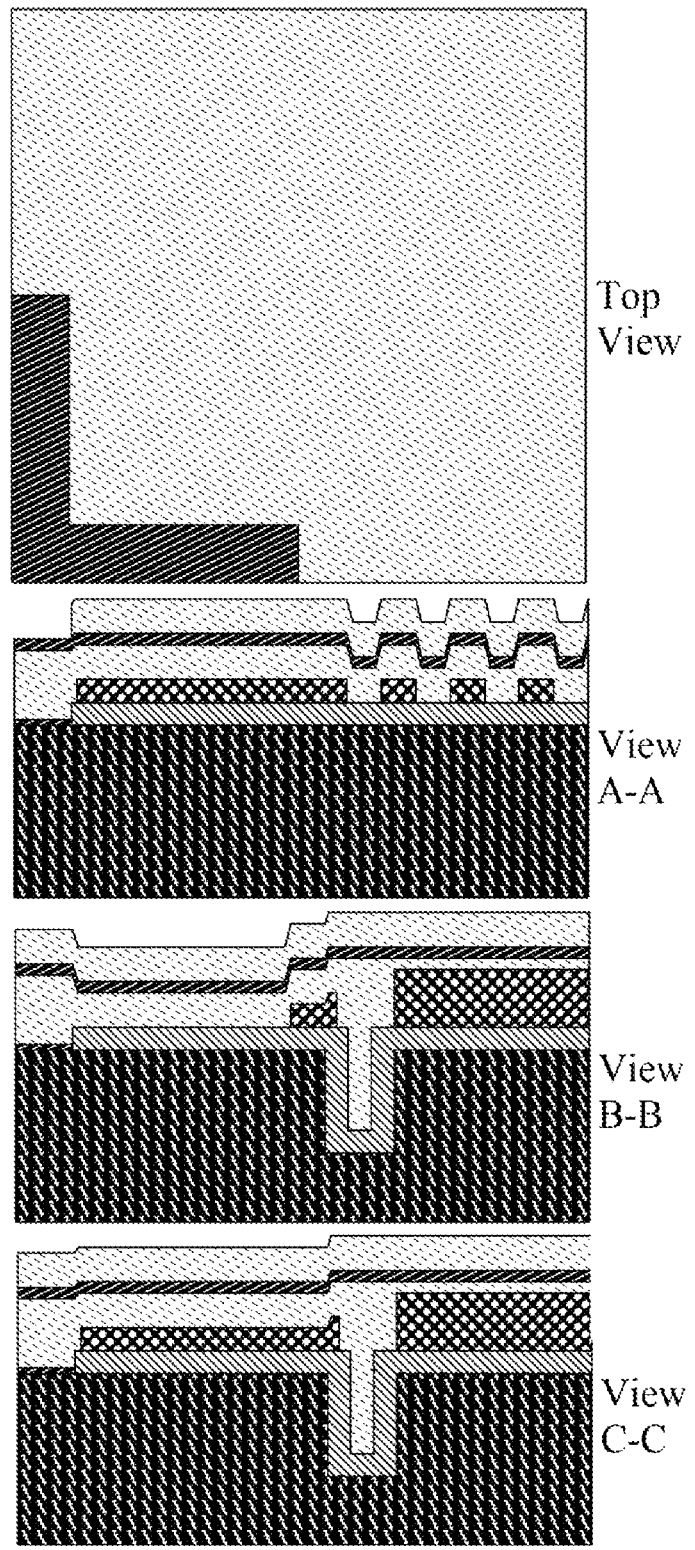
Figure 32 (Step 17)

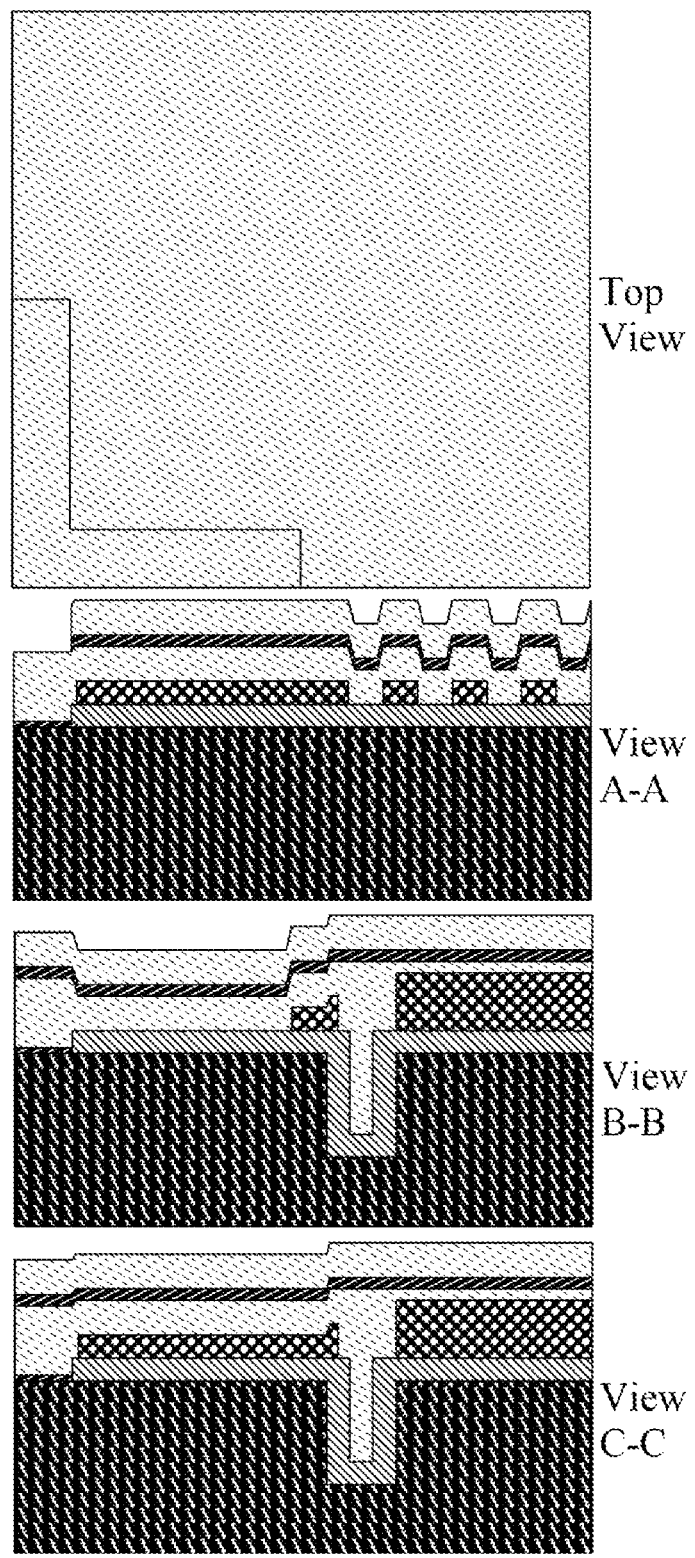
Figure 33 (Step 18)

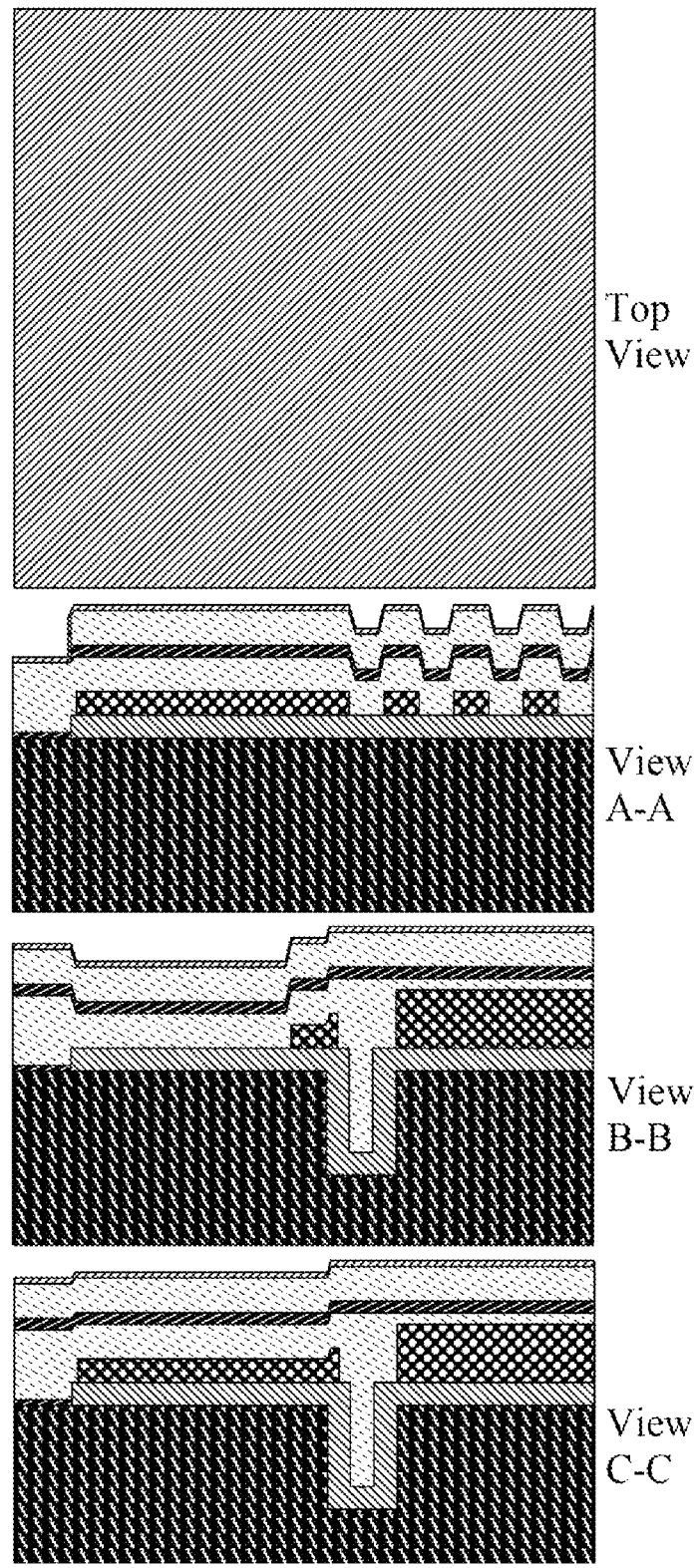
Figure 34 (Step 19)

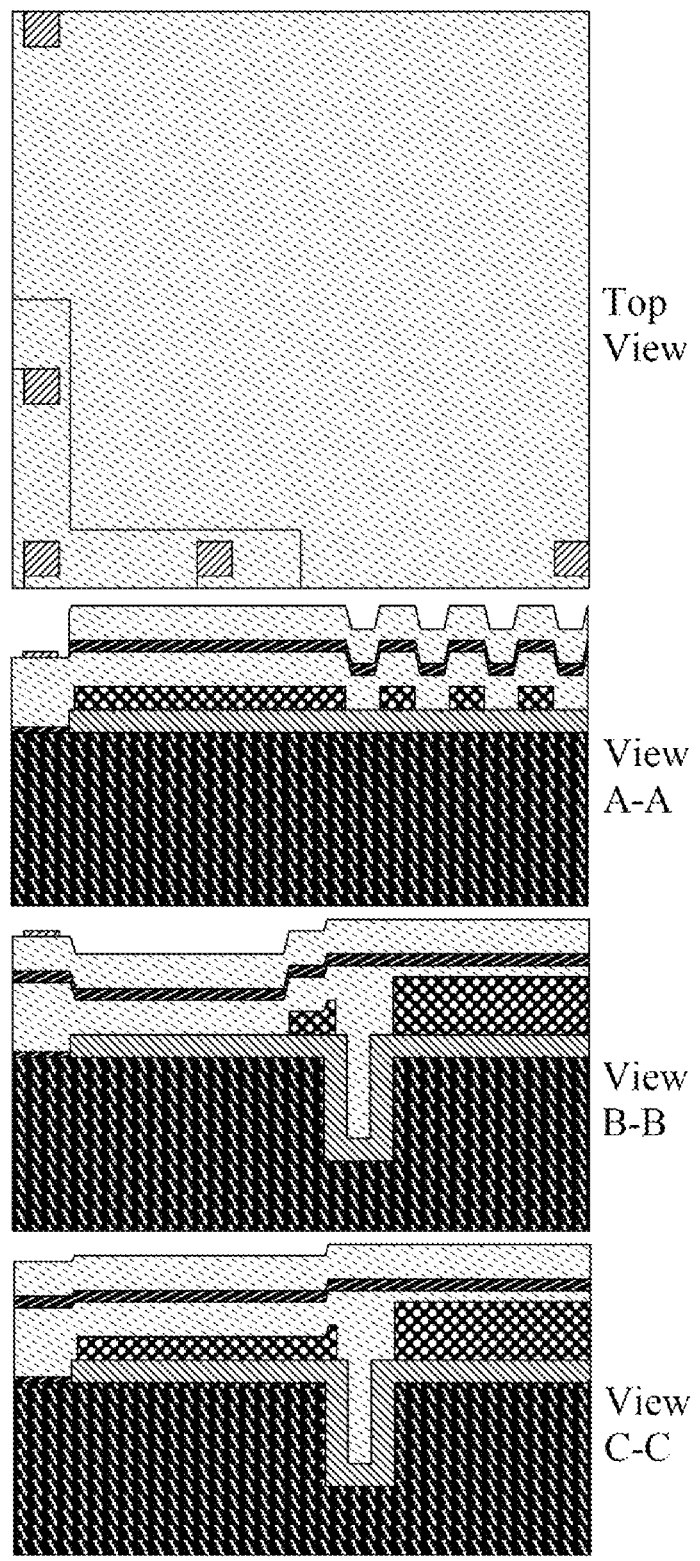
Figure 35 (Step 20)

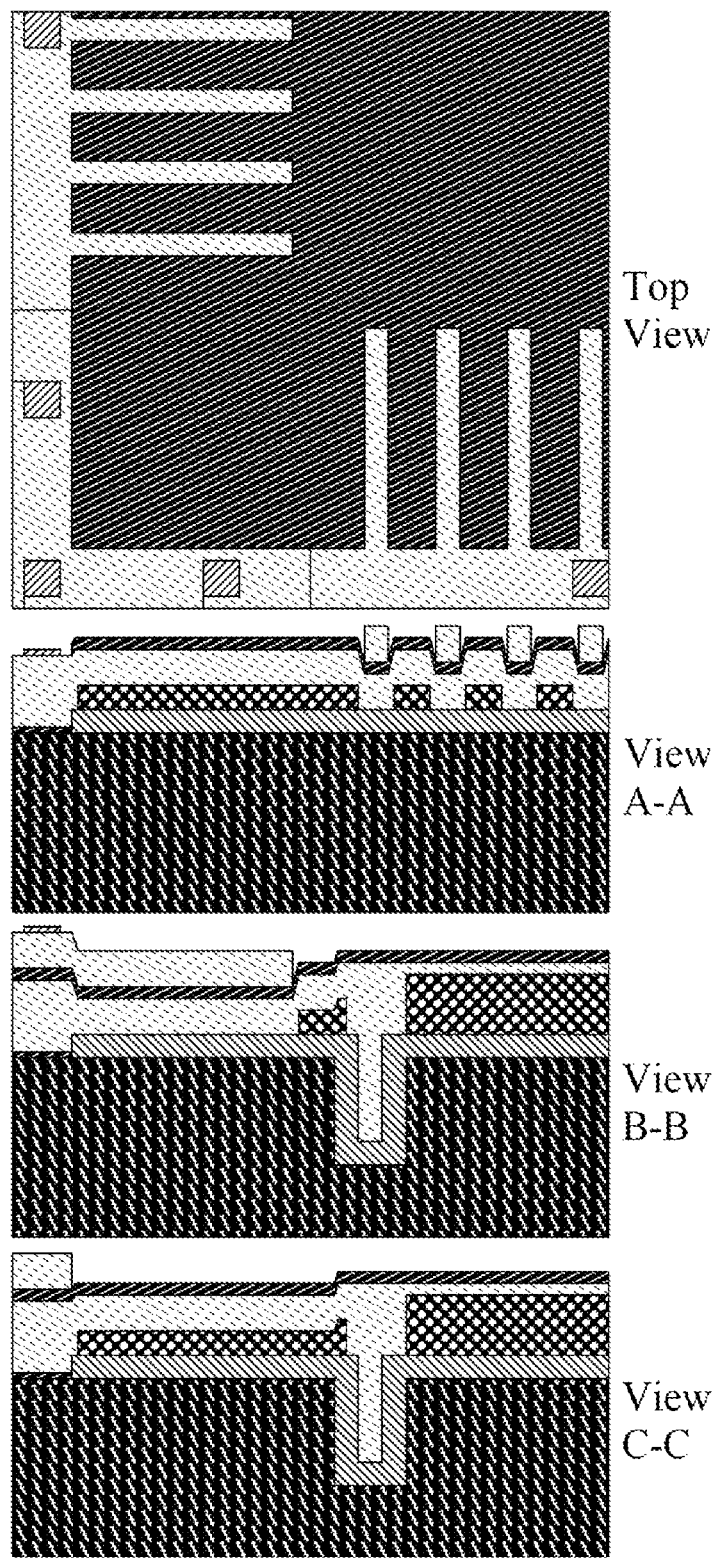
Figure 36 (Step 21)

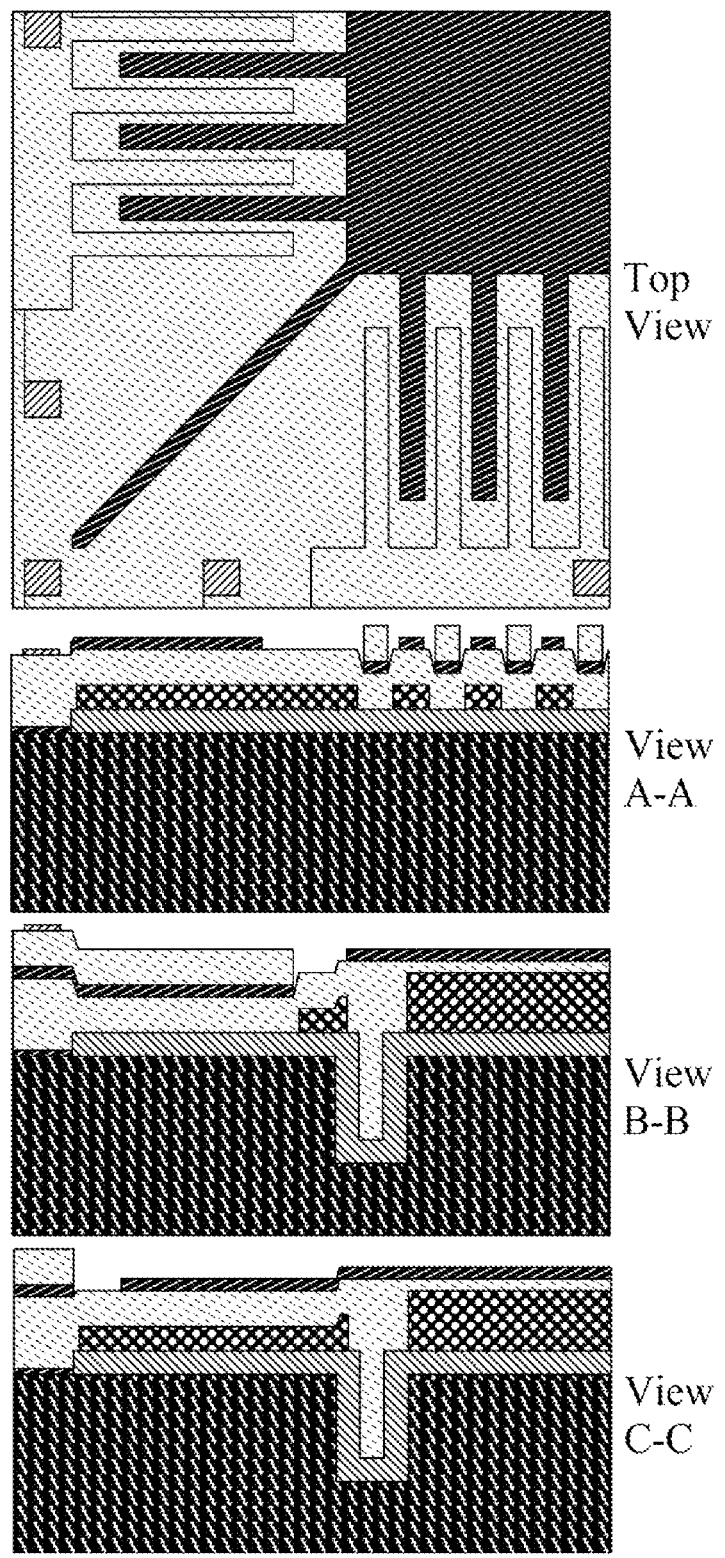
Figure 37 (Step 22)

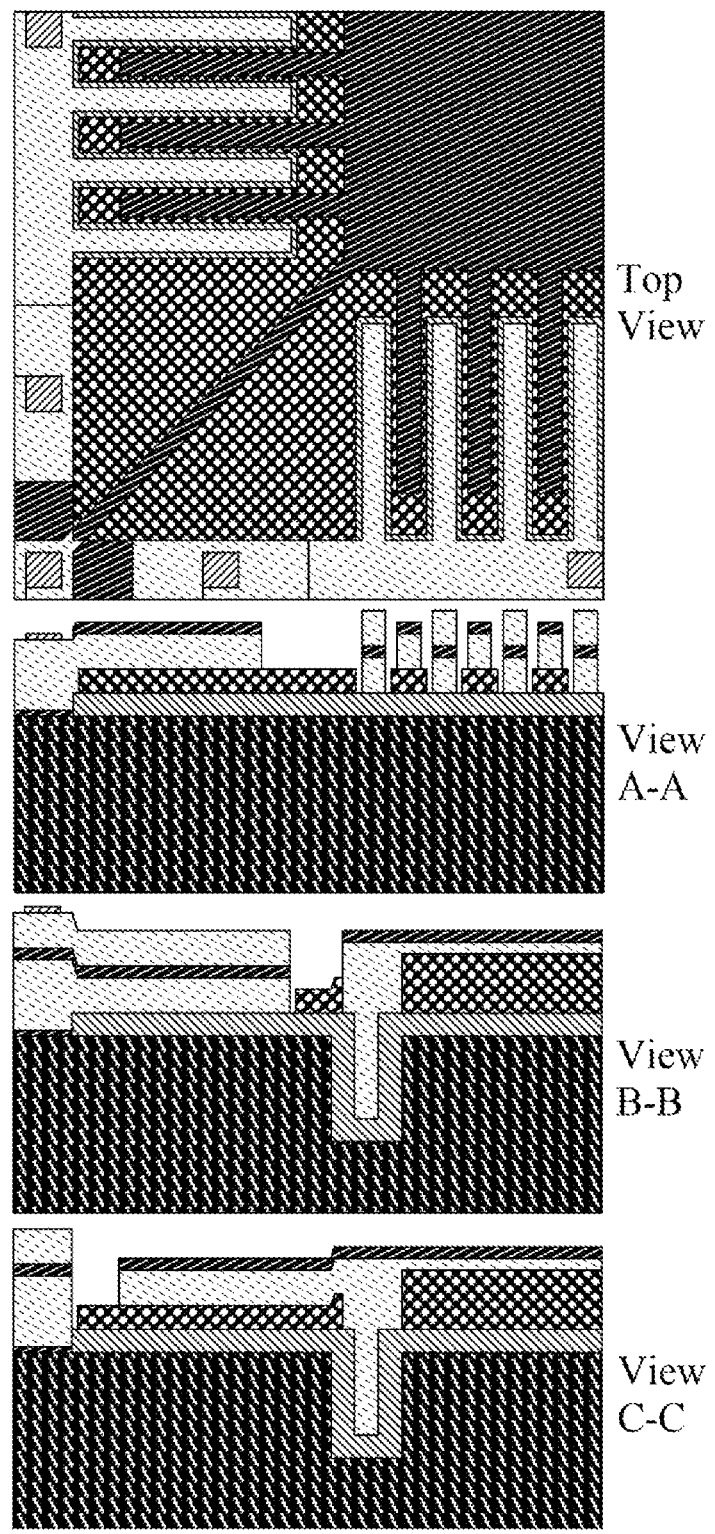
Figure 38 (Step 23)

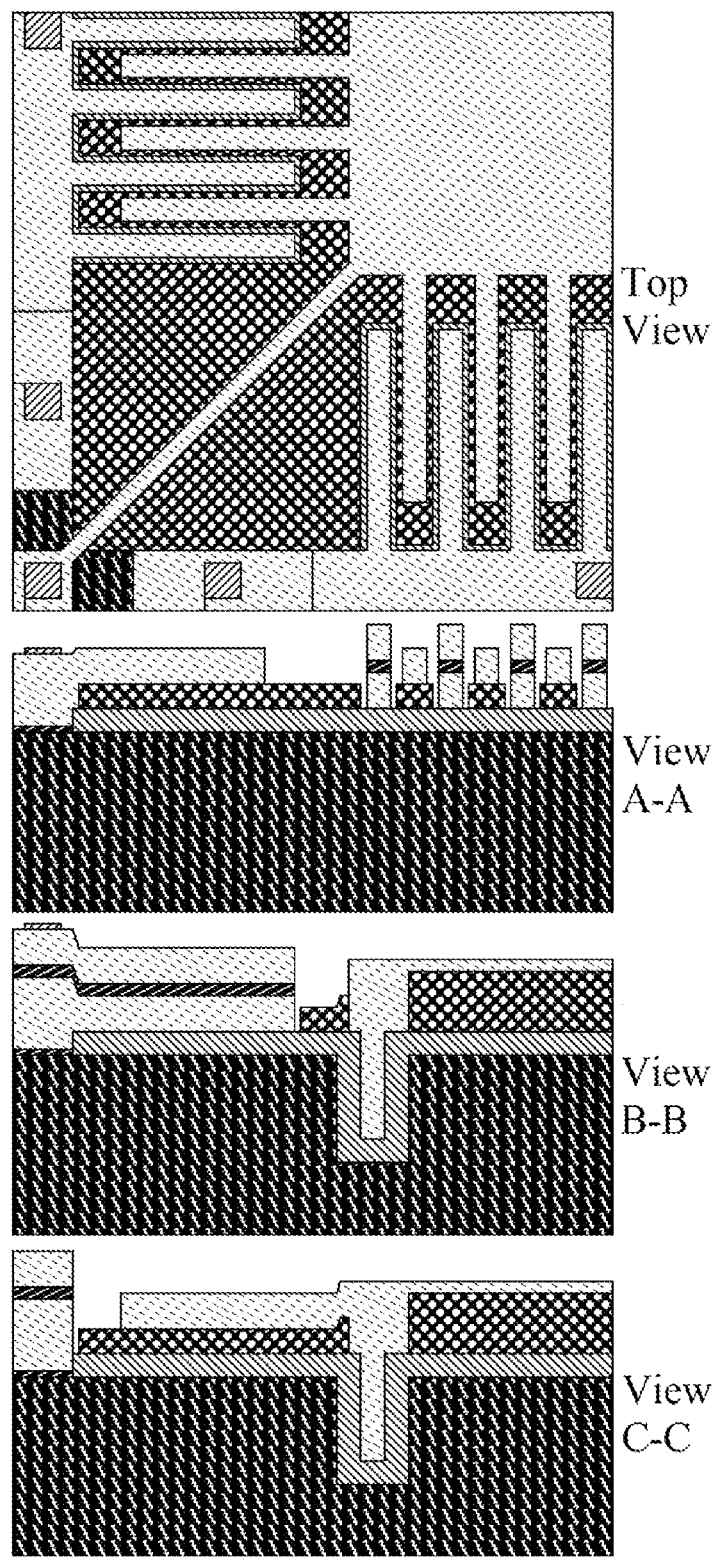
Figure 39 (Step 24)

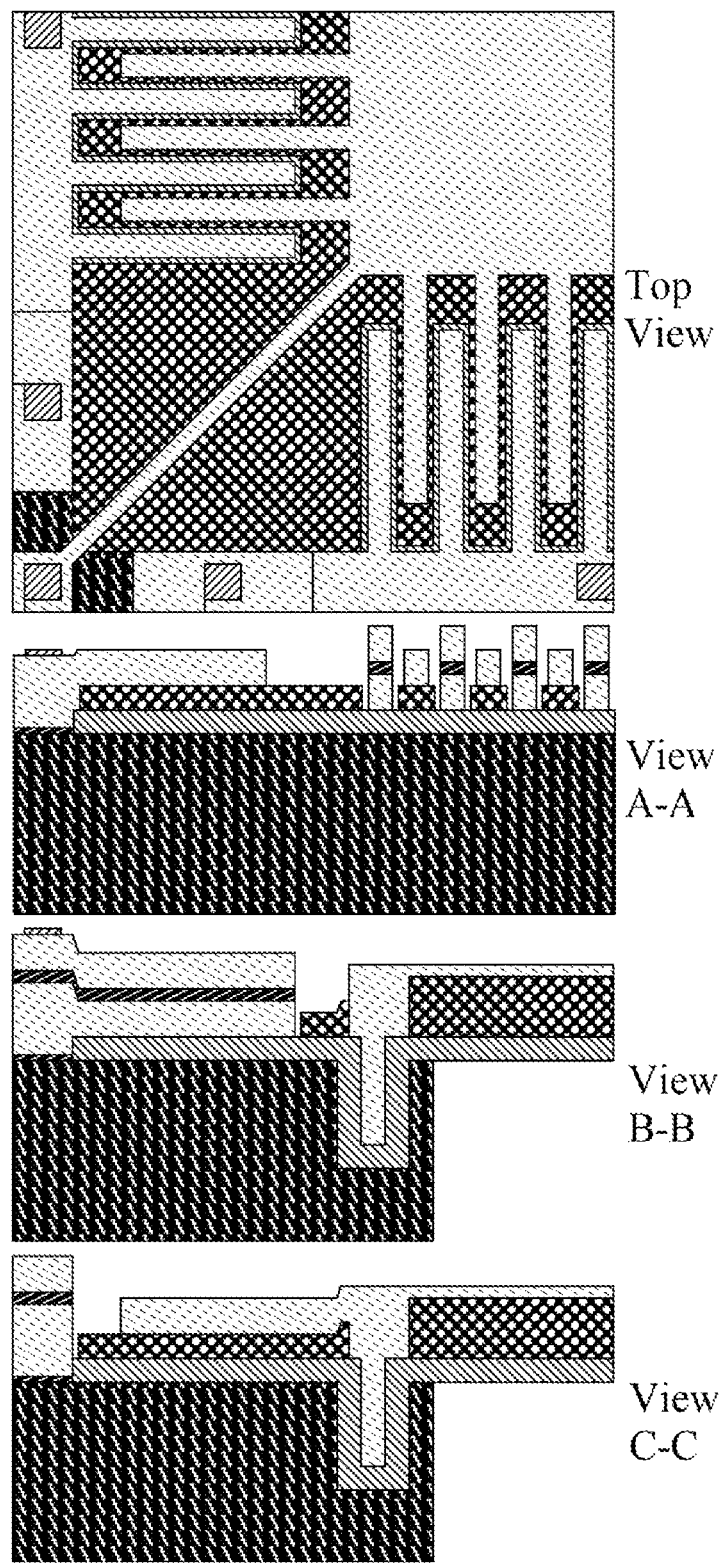
Figure 40 (Step 25)

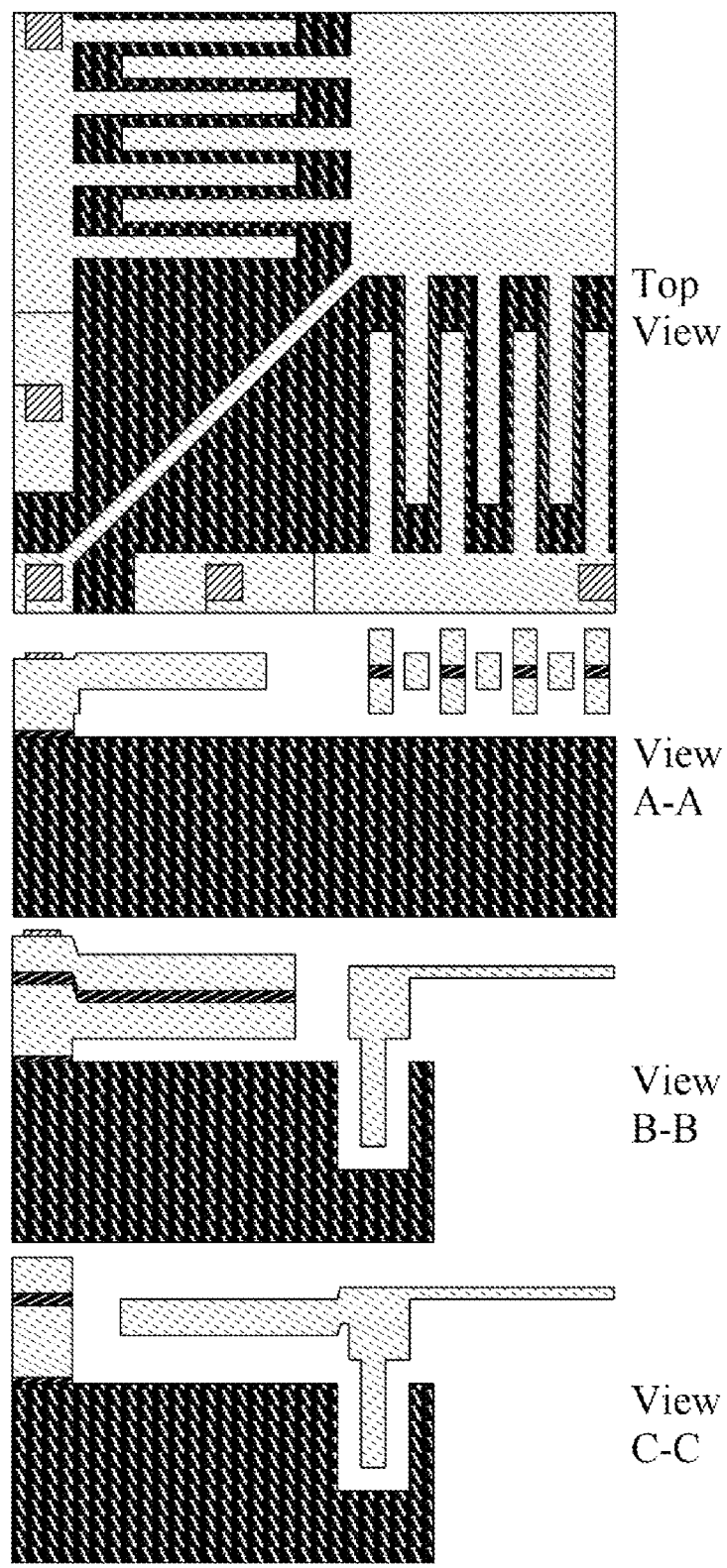
Figure 41 (Step 26)

PROCESS OF FABRICATING LATERAL MODE CAPACITIVE MICROPHONE INCLUDING A CAPACITOR PLATE WITH SANDWICH STRUCTURE

CROSS-REFERENCE TO RELATED U.S. APPLICATIONS

This application is a Continuation-in-Part of U.S. non-provisional application Ser. No. 16/885,271 filed on May 28, 2020, which is a Continuation-in-Part of U.S. non-provisional application Ser. No. 15/730,732 filed on Oct. 12, 2017 (granted as U.S. Ser. No. 10/798,508 on Oct. 6, 2020), which is a Continuation-in-Part of U.S. non-provisional application Ser. No. 15/623,339 filed on Jun. 14, 2017 (granted as U.S. Pat. No. 10,244,330 on Mar. 26, 2019), which is a Continuation-in-Part of U.S. non-provisional application Ser. No. 15/393,831 filed on Dec. 29, 2016 (granted as U.S. Pat. No. 10,171,917 on Jan. 1, 2019), all of which are incorporated herein by reference in their entirety.

FIELD OF THE INVENTION

The present invention generally relates to a process of fabricating a MEMS device, such as a lateral mode capacitive microphone that includes a capacitor plate with a sandwich structure for total performance improvement. The fabricated microphone of the invention may find applications in smart phones, telephones, hearing aids, public address systems for concert halls and public events, motion picture production, live and recorded audio engineering, two-way radios, megaphones, radio and television broadcasting, and in computers for recording voice, speech recognition, VoIP, and for non-acoustic purposes such as ultrasonic sensors or knock sensors, among others.

BACKGROUND OF THE INVENTION

A microelectromechanical system (MEMS) is a microscopic device with moving parts that is fabricated in the same general manner as integrated circuits. For example, a MEMS microphone is a transducer that converts sound into an electrical signal. Among different designs of microphone, a capacitive microphone or a condenser microphone is conventionally constructed employing the so-called "parallel-plate" capacitive design. Unlike other microphone types that require the sound wave to do more work, only a very small mass in capacitive microphones needs be moved by the incident sound wave. Capacitive microphones generally produce a high-quality audio signal and are now the popular choice in consumer electronics, laboratory and recording studio applications, ranging from telephone transmitters through inexpensive karaoke microphones to high-fidelity recording microphones.

FIG. 1A is a schematic diagram of parallel capacitive microphone in the prior art. Two thin layers 101 and 102 are placed closely in almost parallel. One of them is fixed backplate 101, and the other one is movable/deflectable membrane/diaphragm 102, which can be moved or driven by sound pressure. Diaphragm 102 acts as one plate of a capacitor, the vibrations of which produce changes in the distance between two layers 101 and 102, and changes in the mutual capacitance therebetween.

"Squeeze film" and "squeezed film" refer to a type of hydraulic or pneumatic damper for damping vibratory motion of a moving component with respect to a fixed component. Squeezed film damping occurs when the moving component is moving perpendicular and in close proximity to the surface of the fixed component (e.g., between approximately 2 and 50 micrometers). The squeezed film effect results from compressing and expanding the fluid (e.g., a gas or liquid) trapped in the space between the moving plate and the solid surface. The fluid has a high resistance, and damps the motion of the moving component as the fluid flows through the space between the moving plate and the solid surface.

In capacitive microphones as shown in FIG. 1A, squeeze film damping occurs when two layers 101 and 102 are in close proximity to each other with air disposed between them. The layers 101 and 102 are positioned so close together (e.g. within 5 μm) that air can be "squeezed" and "stretched" to slow movement of membrane/diaphragm 101. As the gap between layers 101 and 102 shrinks, air must flow out of that region. The flow viscosity of air, therefore, gives rise to a force that resists the motion of moving membrane/diaphragm 101. Squeeze film damping is significant when membrane/diaphragm 101 has a large surface area to gap length ratio. Such squeeze film damping between the two layers 101 and 102 becomes a mechanical noise source, which is the dominating factor among all noise sources in the entire microphone structure.

Advantageously, the present invention provides a process of fabricating a microphone in which the squeeze film damping is substantially avoided because the movable membrane/diaphragm does not move toward the fixed backplate. Moreover, a capacitor plate with a sandwich structure according to the invention can be fabricated to effectively reduce or cancel systemic or background noise in the microphone.

SUMMARY OF THE INVENTION

The present invention provides a process of fabricating a lateral-mode capacitive microphone. The process includes (A) fabricating a first electrical conductor and a second electrical conductor side by side over a substrate (i.e. they are in a lateral-mode configuration). Step (A) may include (A-1) dividing one of the two electrical conductors into two sub-conductors; and (A-2) sandwiching an electrical insulator between the two sub-conductors, so that mutual capacitance between the two electrical conductors consists of two sub-capacitances generated between another one of the two electrical conductors and the two sub-conductors.

The "lateral-mode" configuration is defined as that the first electrical conductor and the second electrical conductor are configured to have a relative spatial relationship therebetween, and a mutual capacitance (MC) can be generated between the first electrical conductor and the second electrical conductor. The relative spatial relationship and the mutual capacitance can both be varied by an acoustic pressure impacting upon the first electrical conductor and/or the second electrical conductor along a range of impacting directions in 3D space. Given the same strength/intensity of acoustic pressure, the mutual capacitance is varied the most (or maximally varied) by an acoustic pressure impacting upon the first electrical conductor and/or the second electrical conductor along one direction among the range of impacting directions. This direction is defined as the primary direction. The first electrical conductor has a first projection along the primary direction on a conceptual plane that is perpendicular to the primary direction. The second electrical conductor has a second projection along the primary direction on the conceptual plane. The first projection and the second projection have a shortest distance Dmin therebetween, and Dmin remains greater than zero regardless of that the first electrical conductor and/or the second electrical conductor is (are) impacted by an acoustic pressure along the primary direction or not.

In various exemplary embodiments of the invention, one of the above two electrical conductors (preferably the first electrical conductor) includes an electrical insulator sandwiched between two sub-conductors. The above mutual capacitance consists of (or is the sum of) two sub-capacitances that generated between another one of the two electrical conductors (preferably the second electrical conductor) and the two sub-conductors respectively. In preferred embodiments, the two sub-capacitances are approximately equal in the absence of an acoustic pressure impacting upon the above two electrical conductors. In other preferred embodiments, the electrical insulator and the two sub-conductors are stacked over each other along the primary direction (e.g. a three-layer "sandwich" structure).

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

FIG. 16 illustrates step 1 in the process, providing a homogeneous substrate.

FIG. 17 illustrates step 2 in the process, depositing an isolation layer onto the substrate.

FIG. 18 illustrates step 3 in the process, etching and patterning the isolation layer.

FIG. 19 illustrates step 4 in the process, etching and patterning (e.g. deep reactive ion etching (DRIE) on the substrate to form a trench thereinto.

FIG. 20 illustrates step 5 in the process, thermal oxidation.

FIG. 21 illustrates step 6 in the process, depositing a poly silicon layer.

FIG. 22 illustrates step 7 in the process, etching and patterning the poly silicon layer.

FIG. 23 illustrates step 8 in the process, depositing a PSG layer (a removable layer).

FIG. 24 illustrates step 9 in the process, etching and patterning the PSG layer.

FIG. 25 illustrates step 10 in the process, depositing a poly silicon layer.

FIG. 26 illustrates step 11 in the process, etching and patterning the poly silicon layer.

FIG. 27 illustrates step 12 in the process, depositing a PSG layer.

FIG. 28 illustrates step 3 in the process, etching and patterning the PSG layer.

FIG. 29 illustrates step 14 in the process, depositing a poly silicon layer.

FIG. 30 illustrates step 15 in the process, is depositing a silicon nitride layer.

FIG. 31 illustrates step 16 in the process, depositing a poly silicon layer again.

FIG. 32 illustrates step 17 in the process, etching and patterning the poly silicon layer deposited at step 16.

FIG. 33 illustrates step 18 in the process, removing the exposed silicon nitride area.

FIG. 34 illustrates step 19 in the process, depositing a metal layer for pad material.

FIG. 35 illustrates step 20 in the process, etching and patterning pads.

FIG. 36 illustrates step 21 in the process, etching and patterning the exposed poly silicon area.

FIG. 37 illustrates step 22 in the process, etching and patterning the exposed silicon nitride area.

FIG. 38 illustrates step 23 in the process, etching and patterning the exposed poly silicon area.

FIG. 39 illustrates step 24 in the process, removing the exposed silicon nitride area.

FIG. 40 illustrates step 25 in the process, forming a cavity on the backside of the substrate.

FIG. 41 illustrates step 26 in the process, releasing a final product as shown in FIGS. 12B, 13, 14 and 15.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Figure 1A:
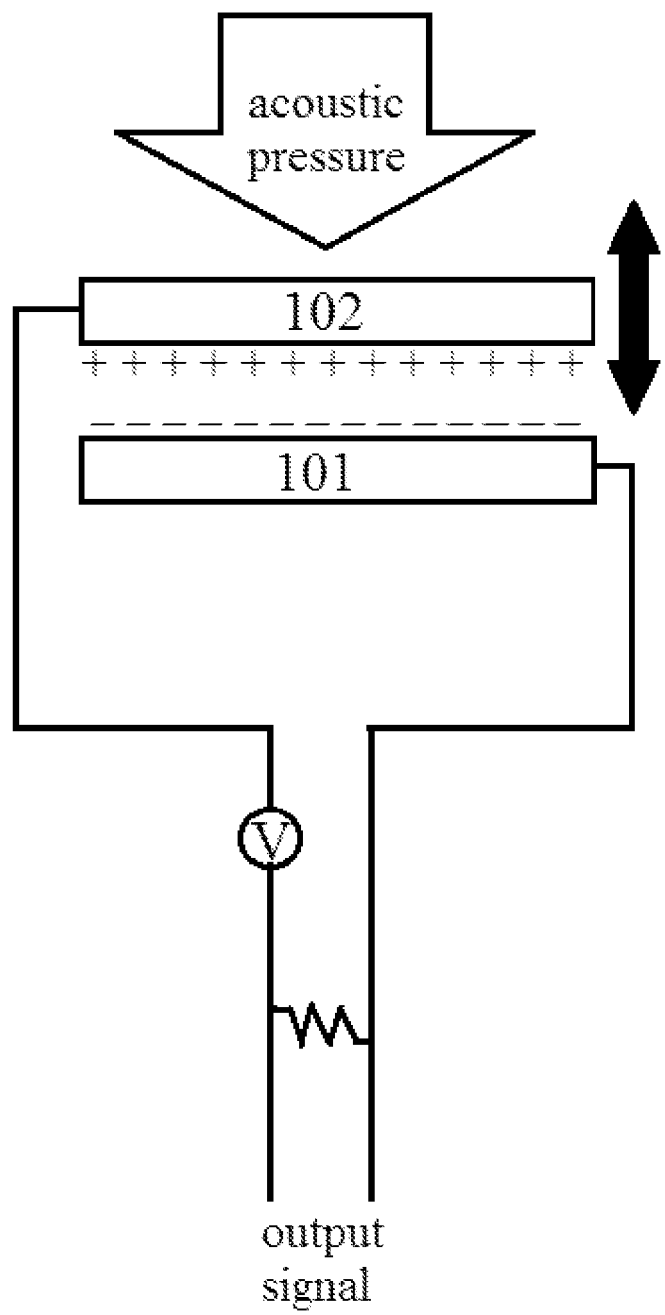
FIG. 1A shows a conventional capacitive microphone in the prior art.
Figure 1B:
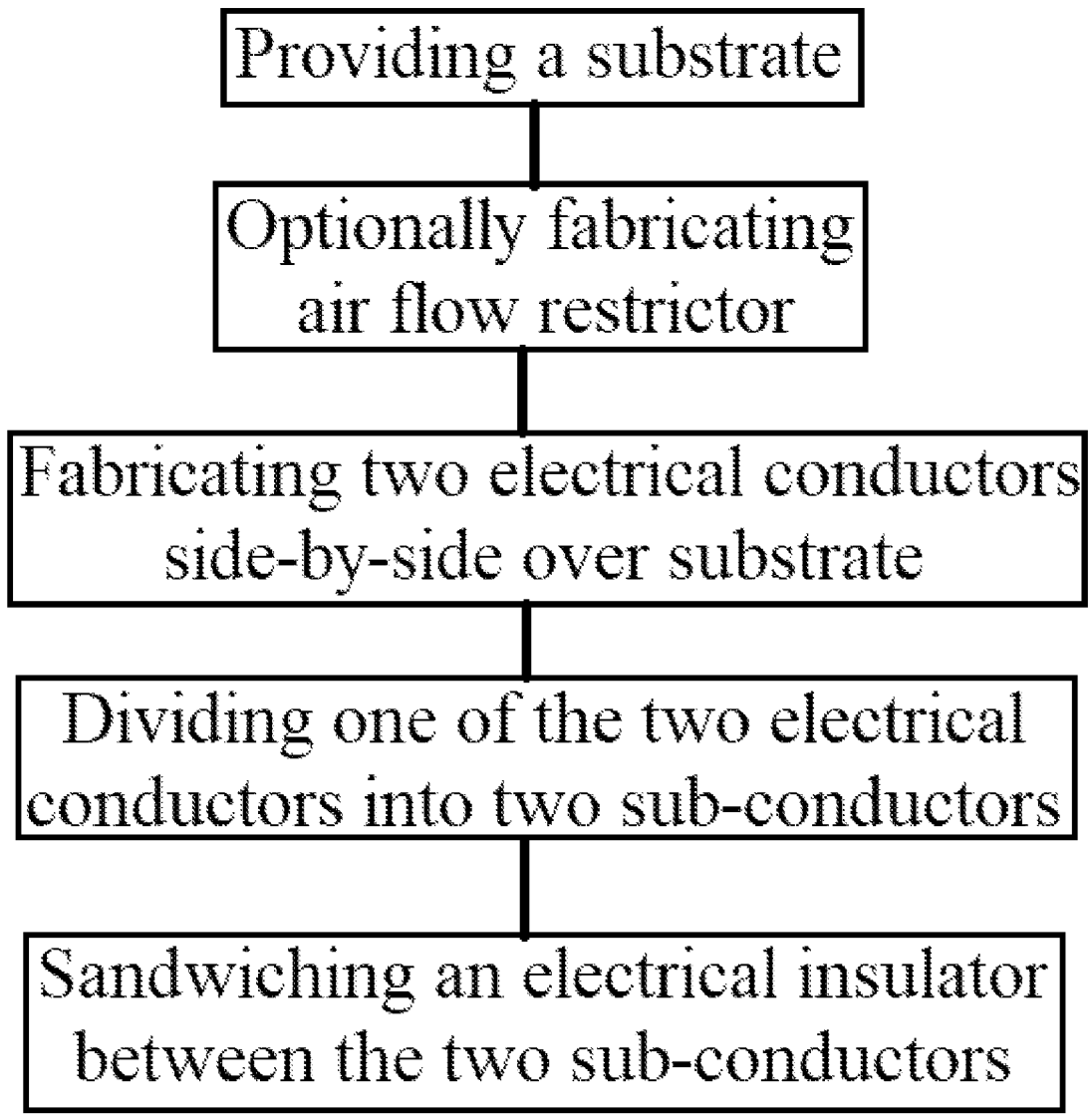
FIG. 1B shows a general process for fabricating a lateral-mode capacitive microphone in accordance with an exemplary embodiment of the present invention.

FIG. 1B shows a general process for fabricating a lateral-mode capacitive microphone in accordance with exemplary embodiments of the present invention. The process comprises the steps of providing a substrate, optionally fabricating an air flow restrictor, fabricating two electrical conductors side-by-side over the substrate, dividing one of the two electrical conductors into two sub-conductors, and sandwiching an electrical insulator between the two sub-conductors. The step of fabricating an air flow restrictor may include etching the planar surface of the substrate to form a trench and forming an insert that is protruded from one of the two electrical conductors and downward into the trench.

The process of FIG. 1B can be accomplished using surface micromachining techniques, bulk micromachining techniques, high aspect ratio (HAR) silicon micromachining, and semiconductor processing techniques etc.

Surface micromachining creates structures on top of a substrate using a succession of thin film deposition and selective etching. Generally, polysilicon is used as one of the layers and silicon dioxide is used as a sacrificial layer which is removed or etched out to create the necessary void in the thickness direction. Added layers are generally very thin with their size varying from 2-5 micrometers. A main advantage is realizing monolithic microsystems in which the electronic and the mechanical components (functions) are built in on the same substrate. As the structures are built on top of the substrate and not inside it, the substrate's properties are not as important as in bulk micromachining, and the expensive silicon wafers can be replaced by cheaper substrates, such as glass, plastic, PET substrate, or other non-rigid materials. The size of the substrates can also be much larger than a silicon wafer.

Complicated components, such as movable parts, are built using a sacrificial layer. For example, a suspended cantilever can be built by depositing and structuring a sacrificial layer, which is then selectively removed at the locations where the future beams must be attached to the substrate (i.e. the anchor points). The structural layer is then deposited on top of the polymer and structured to define the beams. Finally, the sacrificial layer is removed to release the beams, using a selective etch process that will not damage the structural layer. There are many possible combinations of structural/sacrificial layer. The combination chosen depends on the process. For example it is important for the structural layer not to be damaged by the process used to remove the sacrificial layer.

Bulk micromachining produces structures inside a substrate by selectively etching inside the substrate. Bulk micromachining starts with a silicon wafer or other substrates which is selectively etched, using photolithography to transfer a pattern from a mask to the surface. Bulk micromachining can be performed with wet or dry etches, although the most common etch in silicon is the anisotropic wet etch. This etch takes advantage of the fact that silicon has a crystal structure, which means its atoms are all arranged periodically in lines and planes. Certain planes have weaker bonds and are more susceptible to etching. The etch results in pits that have angled walls, with the angle being a function of the crystal orientation of the substrate.

Silicon wafer can be anisotropically wet etched, forming highly regular structures. Wet etching typically uses alkaline liquid solvents, such as potassium hydroxide (KOH) or tetramethylammonium hydroxide (TMAH) to dissolve silicon which has been left exposed by the photolithography masking step. These alkali solvents dissolve the silicon in a highly anisotropic way, with some crystallographic orientations dissolving up to 1000 times faster than others. Such an approach is often used with very specific crystallographic orientations in the raw silicon to produce V-shaped grooves. The surface of these grooves can be atomically smooth if the etch is carried out correctly, and the dimensions and angles can be precisely defined.

In various embodiments of the invention, the microphone is made using a MEMS manufacturing process. Materials for the process include silicon, polymers, metals, and ceramics etc. Deposition processes can be carried out using physical deposition and chemical deposition. Patterning can be carried out using lithography, electron beam lithography, ion beam lithography, ion track technology, X-ray lithography, and diamond patterning. Wet etching can be carried out using isotropic etching, anisotropic etching, HF etching, and electrochemical etching. Dry etching can be carried out using vapor etching (e.g. xenon difluoride) and plasma etching (e.g. sputtering and reactive ion etching (RIE)).

Figure 2A:
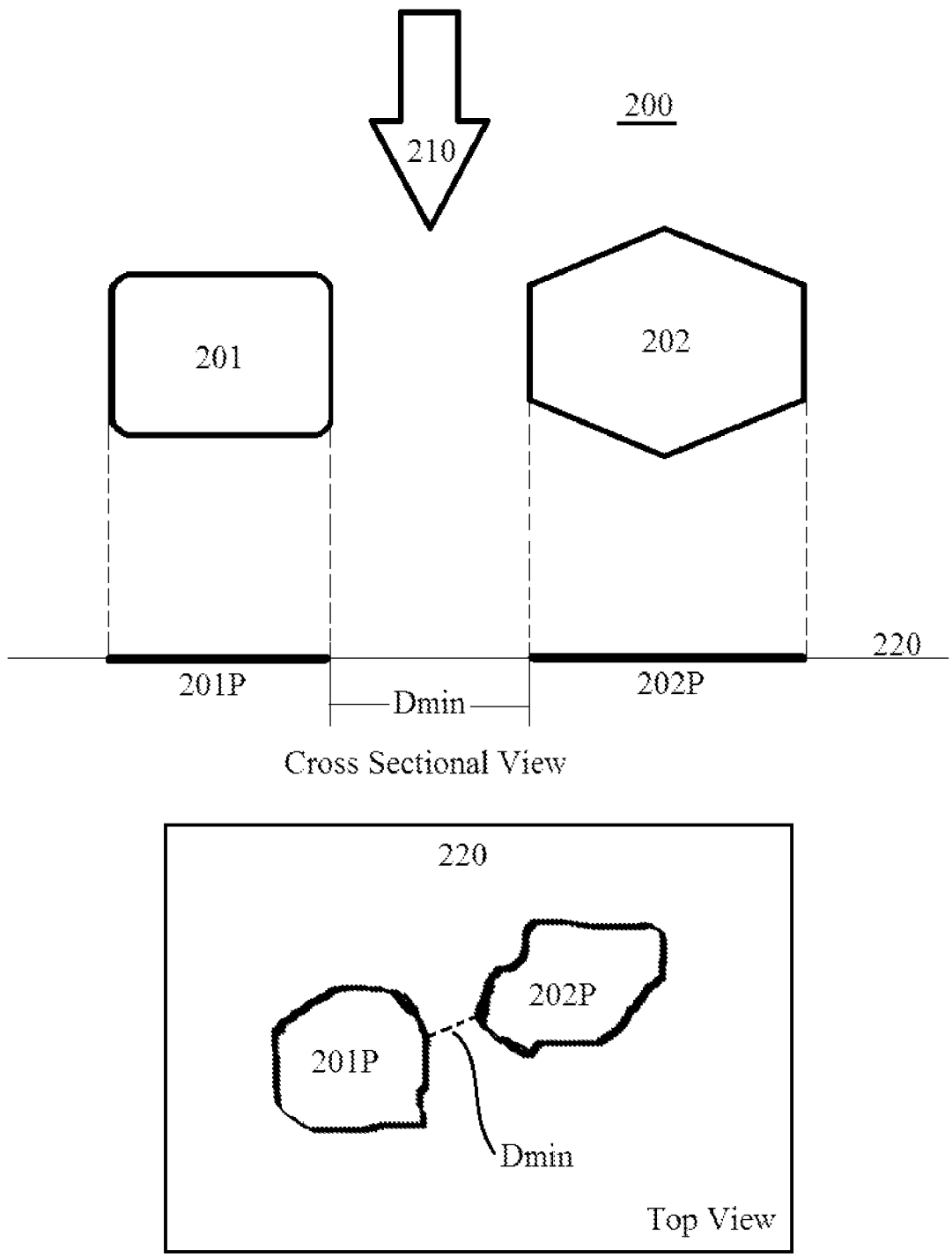
FIG. 2A schematically shows a lateral mode capacitive microphone in accordance with an exemplary embodiment of the present invention.
Figure 3:
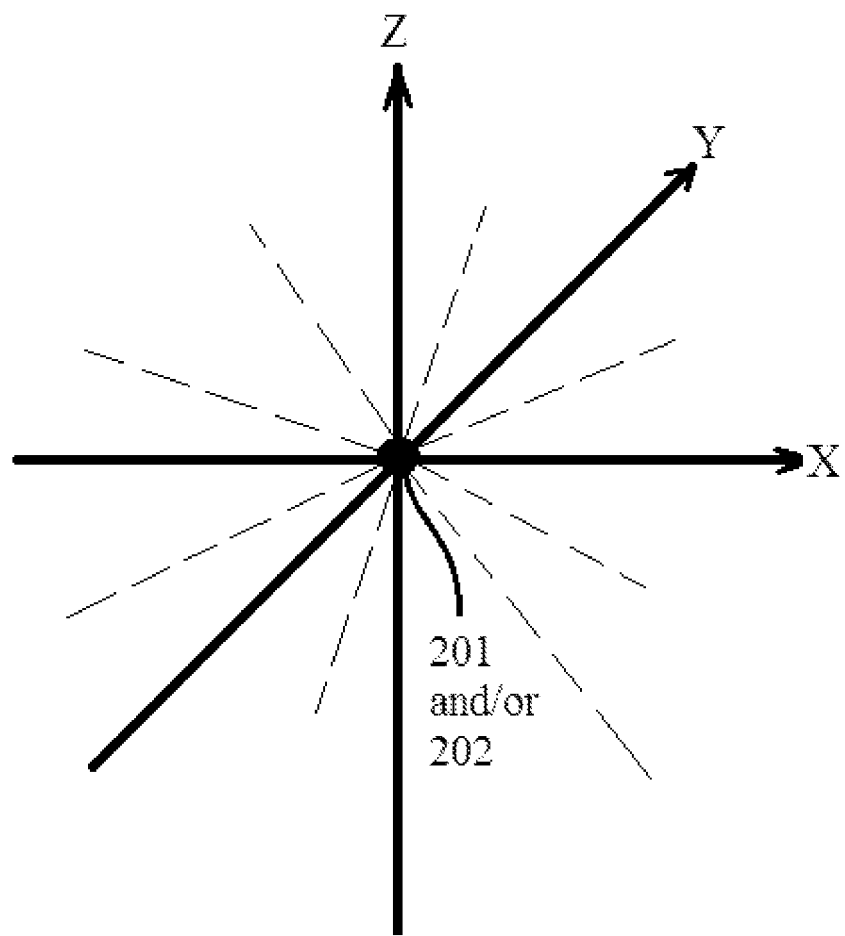
FIG. 3 illustrates acoustic pressures impacting a microphone along a range of directions.
Figure 4:
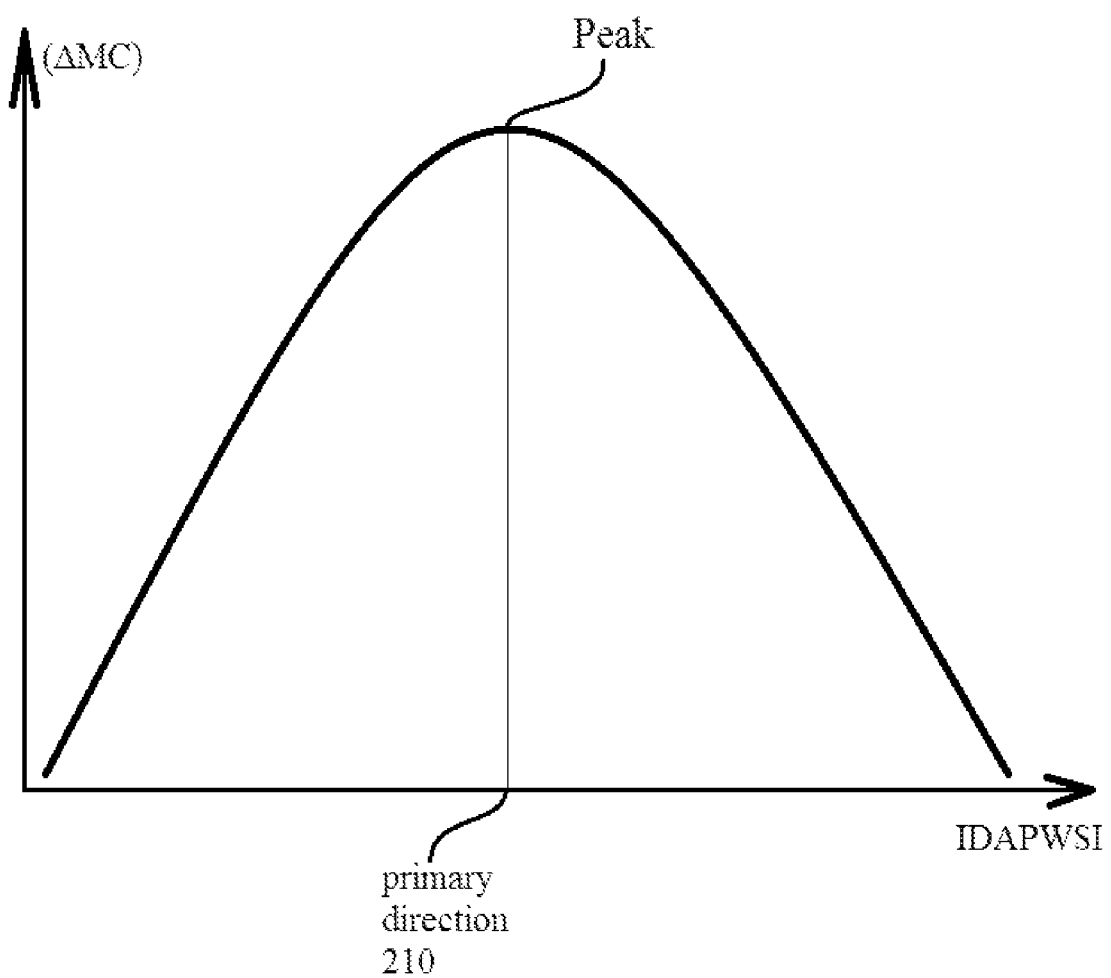
FIG. 4 illustrates the methodology on how to determine the primary direction for the internal components in a microphone in accordance with an exemplary embodiment of the present invention.

FIG. 2A illustrates a capacitive microphone 200 such as a MEMS microphone fabricated according to various embodiments of the invention. A first electrical conductor 201 and a second electrical conductor 202 are so fabricated that they have a relative spatial relationship therebetween so that a mutual capacitance can be generated between them. The first electrical conductor 201 and the second electrical conductor 202 are independently of each other made of polysilicon, gold, silver, nickel, aluminum, copper, chromium, titanium, tungsten, and platinum. The relative spatial relationship as well as the mutual capacitance can both be varied by an acoustic pressure impacting upon the first electrical conductor 201 and/or the second electrical conductor 202. As shown in FIG. 3, the acoustic pressure may impact conductor 201 and/or 202 along a range of impacting directions in 3D space as represented by dotted lines. Given the same strength/intensity of acoustic pressure, the mutual capacitance can be varied the most (or maximally varied) by an acoustic pressure impacting upon the first electrical conductor 201 and/or the second electrical conductor 202 along a certain direction among the above range of impacting directions as shown in FIG. 3. The variation of mutual capacitance (ΔMC) caused by various impacting directions of acoustic pressure from 3D space with same intensity (IDAPWSI) is conceptually plotted in FIG. 4. A primary direction is defined as the impacting direction that generates the peak value of ΔMC, and is labeled as direction 210 in FIG. 2A. It should be appreciated that, given the same strength/intensity of acoustic pressure, the relative spatial relationship can be varied the most (or maximally varied) by an acoustic pressure impacting upon the first electrical conductor 201 and/or the second electrical conductor 202 along a certain direction X among the range of impacting directions as shown in FIG. 3. Direction X may be the same as, or different from, the primary direction 210 as defined above. In some embodiments of the invention, the primary direction may be alternatively defined as the direction X.

Referring back to FIG. 2A, the first electrical conductor 201 has a first projection 201P along the primary direction 210 on a conceptual plane 220 that is perpendicular to the primary direction 210. The second electrical conductor 202 has a second projection 202P along the primary direction 210 on the conceptual plan 220e. The first projection 201P and the second projection 202P have a shortest distance Dmin therebetween. In the present invention, Dmin may be constant or variable, but it is always greater than zero, no matter the first electrical conductor 201 and/or the second electrical conductor 202 is (are) impacted by an acoustic pressure along the primary direction 210 or not.

Figure 2B:
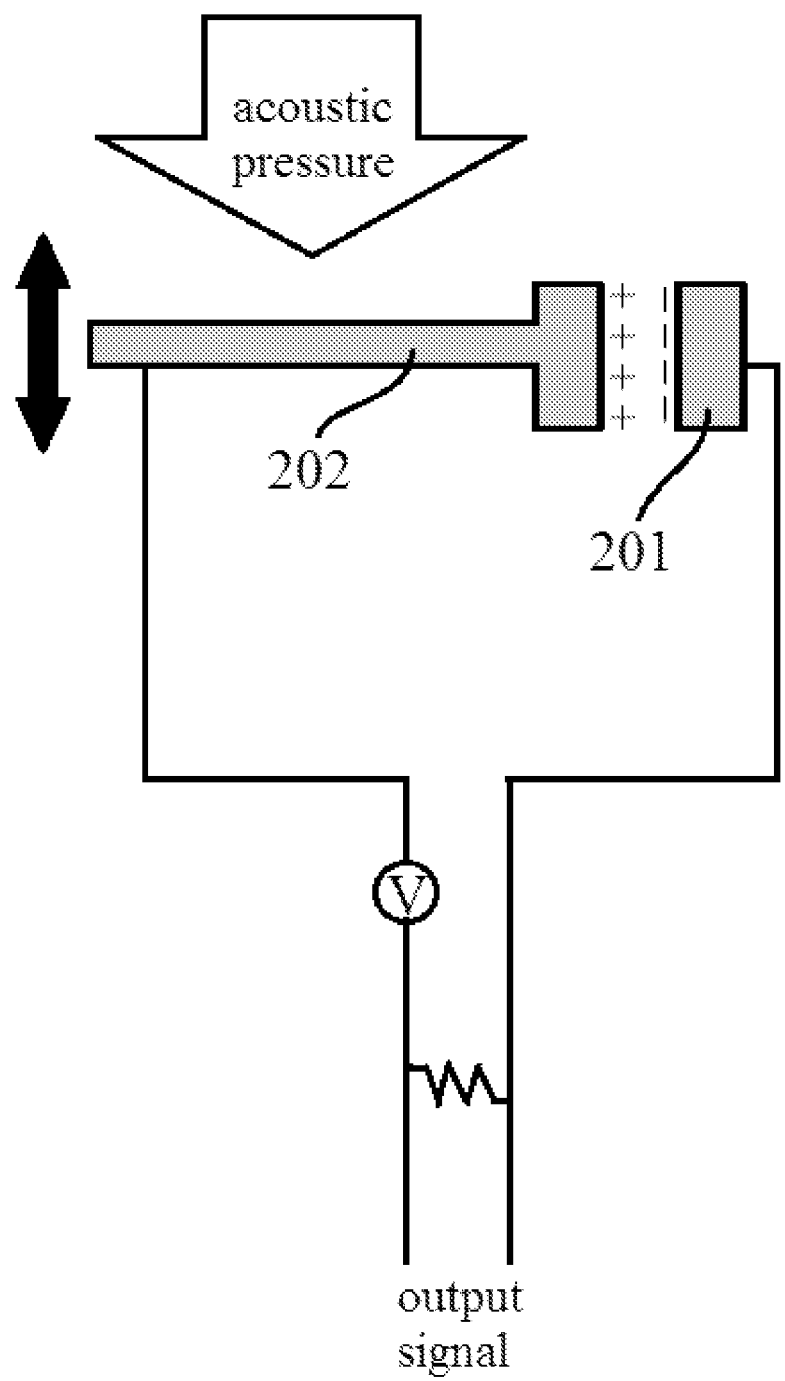
FIG. 2B illustrates a lateral mode capacitive microphone in accordance with an exemplary embodiment of the present invention.

FIG. 2B illustrates an exemplary embodiment of the fabricated microphone of FIG. 2A. First electrical conductor 201 is stationary, and has a function similar to the fixed backplate in the prior art. A large flat area of second electrical conductor 202, similar to movable/deflectable membrane/diaphragm 102 in FIG. 1A, receives acoustic pressure and moves up and down along the primary direction, which is perpendicular to the flat area. However, conductors 201 and 202 are so fabricated that they are in a side-by-side spatial relationship relative to the primary direction 210 (rather than a stacked "one-above-another" configuration along the primary direction 210). As one "plate" of the capacitor, second electrical conductor 202 does not move toward and from first conductor 201. Instead, second conductor 202 laterally moves over, or "glides" over, first conductor 201, producing a change in the overlapped area between 201 and 202, and therefore varying the mutual capacitance therebetween. A capacitive microphone based on such a relative movement between conductors 201 and 202 is called lateral mode capacitive microphone in the present invention.

Figure 2C:
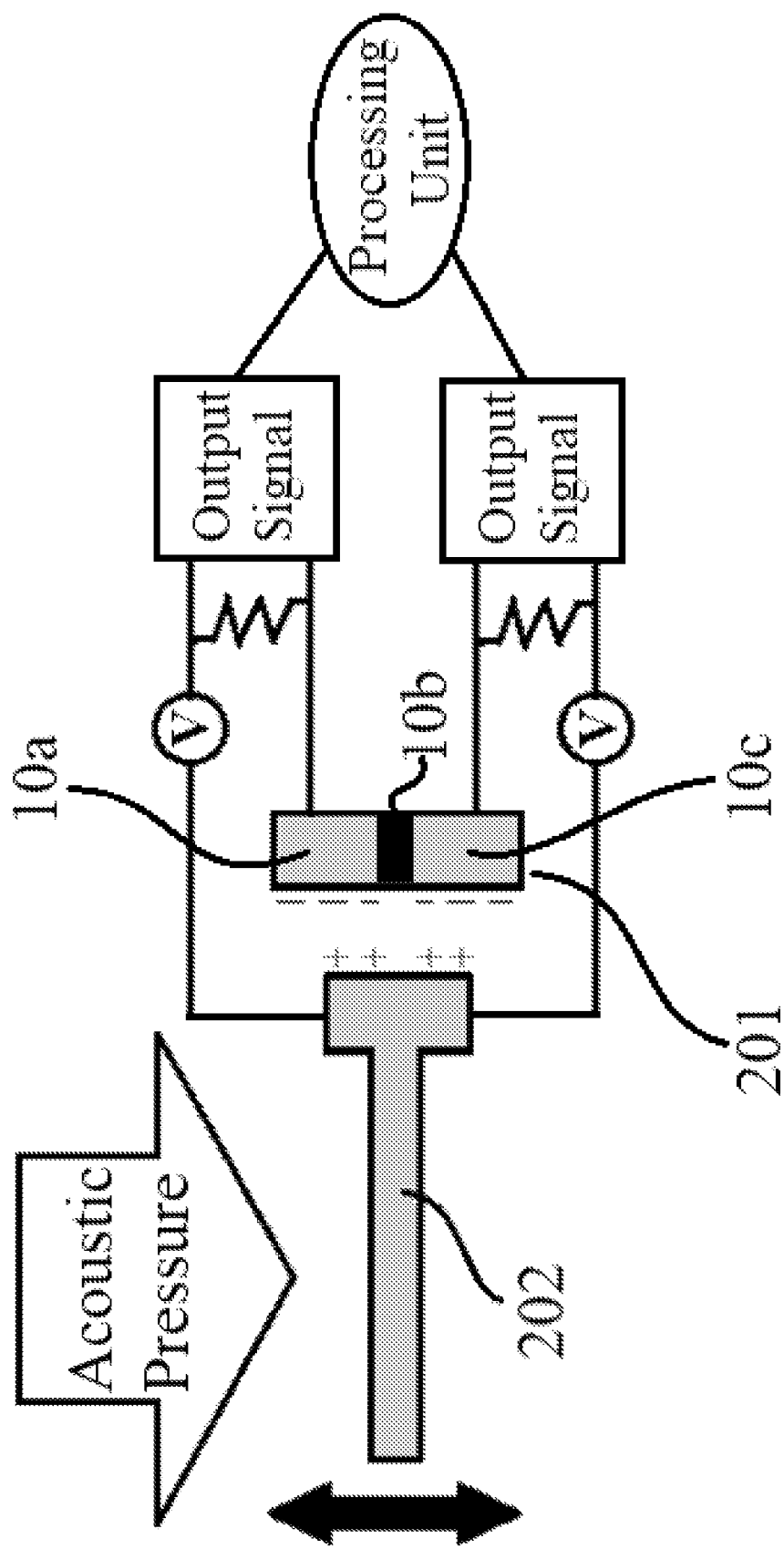
FIG. 2C illustrates a lateral mode capacitive microphone that includes a capacitor plate with a sandwich structure in accordance with an exemplary embodiment of the present invention.

FIG. 2C illustrates an exemplary embodiment of the microphone of FIG. 2B. Anyone of the two electrical conductors 201 and 202, preferably the first electrical conductor 201, may be so fabricated that it includes an electrical insulator 10b (e.g. made of silicon nitride) sandwiched between two sub-conductors 10a and 10c. Another one of the two electrical conductors 201 and 202, preferably the second electrical conductor 202, may be so fabricated that it does not include such an electrical insulator 10b, let alone sandwiched between two sub-conductors. Now, the mutual capacitance (MC) between electrical conductors 201 and 202 consists of (or is the sum of) two sub-capacitances MC1 and MC2. MC1 is generated between second electrical conductor 202 and sub-conductor 10a. MC2 is generated between second electrical conductor 202 and sub-conductor 10c. MC=MC1+MC2. In preferred embodiments, the two sub-capacitances MC1 and MC2 are approximately equal in the absence of an acoustic pressure impacting upon the two electrical conductors 201 and 202. For example, MC1=45-55% MC, MC2=55-45% MC, and MC=MC1+MC2. In other preferred embodiments, the electrical insulator 10b and the two sub-conductors (10a and 10c) may be so fabricated that they are stacked over each other along the primary direction 210 (e.g. a three-layer "sandwich" structure). In more preferred embodiments, the overlapped area (OA1) between conductor 202 and sub-conductors 10a may be so fabricated that it is approximately the same as that between conductor 202 and sub-conductors 10c (OA2) in the absence of an acoustic pressure impacting upon the two electrical conductors 201 and 202. For example, OA1 may be so fabricated that it is in a range of from 0.9×OA2 to 1.1×OA2. In even more preferred embodiments, the height (as measured along the primary direction 210) of the overlapped area between conductor 202 and sub-conductors 10a (OH1) may be so fabricated that it is approximately the same as that between conductor 202 and sub-conductors 10c (OH2) in the absence of an acoustic pressure impacting upon the above two electrical conductors 201 and 202. For example, OH1 may be between 0.9×OH2 and 1.1×OH2. When the MEMS device is in operation, the difference between the value of the changes of MC1 and the value of the changes of MC2, i.e. ΔMC1-ΔMC2 may be provided as the output signal, which will result in an amplitude of signal approximately sum of the amplitude of signal ΔMC1 and the amplitude of signal ΔMC2 because ΔMC1 and ΔMC2 have opposite signal phases when driven by acoustic waves, and which will help reduce systematical noises that come from several sources such as radio-frequency interference (RFI).

In exemplary embodiments of the invention, the microphone may be a MEMS (Microelectromechanical System) microphone, AKA chip/silicon microphone. Typically, a pressure-sensitive diaphragm is etched directly into a silicon wafer by MEMS processing techniques, and is usually accompanied with integrated preamplifier. For a digital MEMS microphone, it may be so fabricated that it includes built-in analog-to-digital converter (ADC) circuits on the same CMOS chip making the chip a digital microphone and therefore more readily integrated with digital products.

Figure 5:
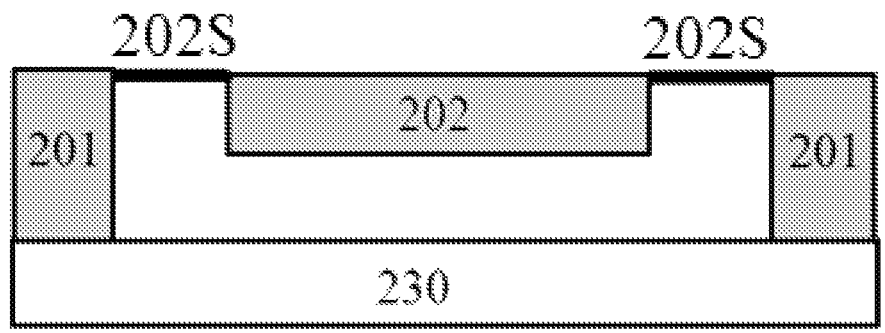
FIG. 5 schematically shows a MEMS capacitive microphone in accordance with an exemplary embodiment of the present invention.
Figure 5:
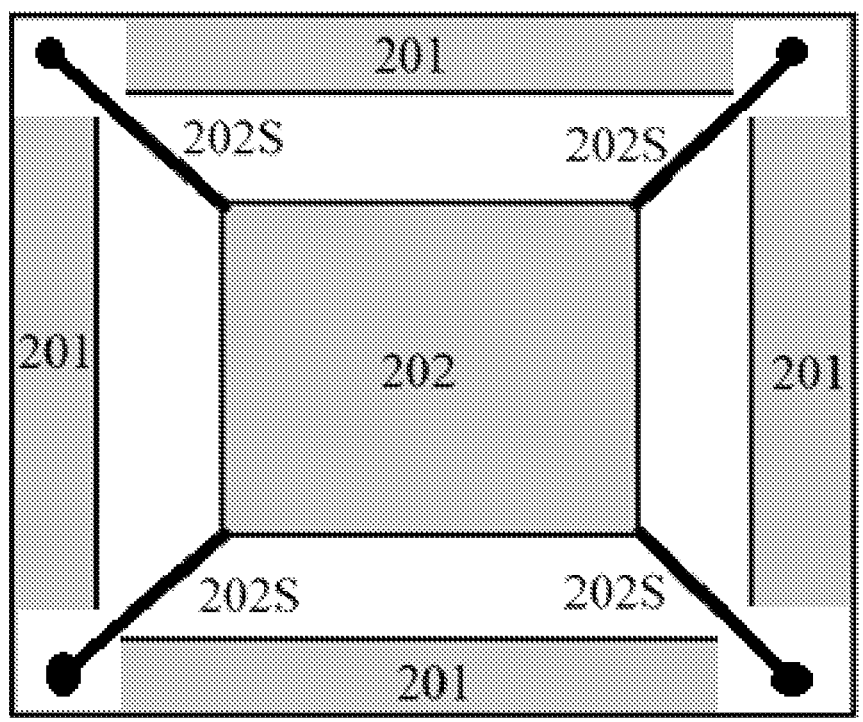

In an embodiment as shown in FIG. 5, capacitive microphone 200 may be fabricated on a substrate 230 such as silicon. The substrate 230 can be viewed as the conceptual plane 220 in FIG. 2A. The first electrical conductor 201 and the second electrical conductor 202 may be so fabricated that it they are side-by-side above the substrate 230. Alternatively, first electrical conductor 201 may be so fabricated to surround the second electrical conductor 202, as shown in FIG. 5. In an exemplary embodiment, first electrical conductor 201 may be so fabricated that it is fixed relative to the substrate 230. On the other hand, second electrical conductor 202 may be so fabricated that it contains a membrane that is movable up-and-down relative to the substrate 230. The primary direction may be (is) perpendicular to the membrane plane 202. The movable membrane 202 may be so fabricated that it is attached to the substrate 230 via three or more suspensions 202S such as four suspensions 202S. As will be described and illustrated later, each of the suspension 202S may be so fabricated that it comprises folded and symmetrical cantilevers.

Figure 6:
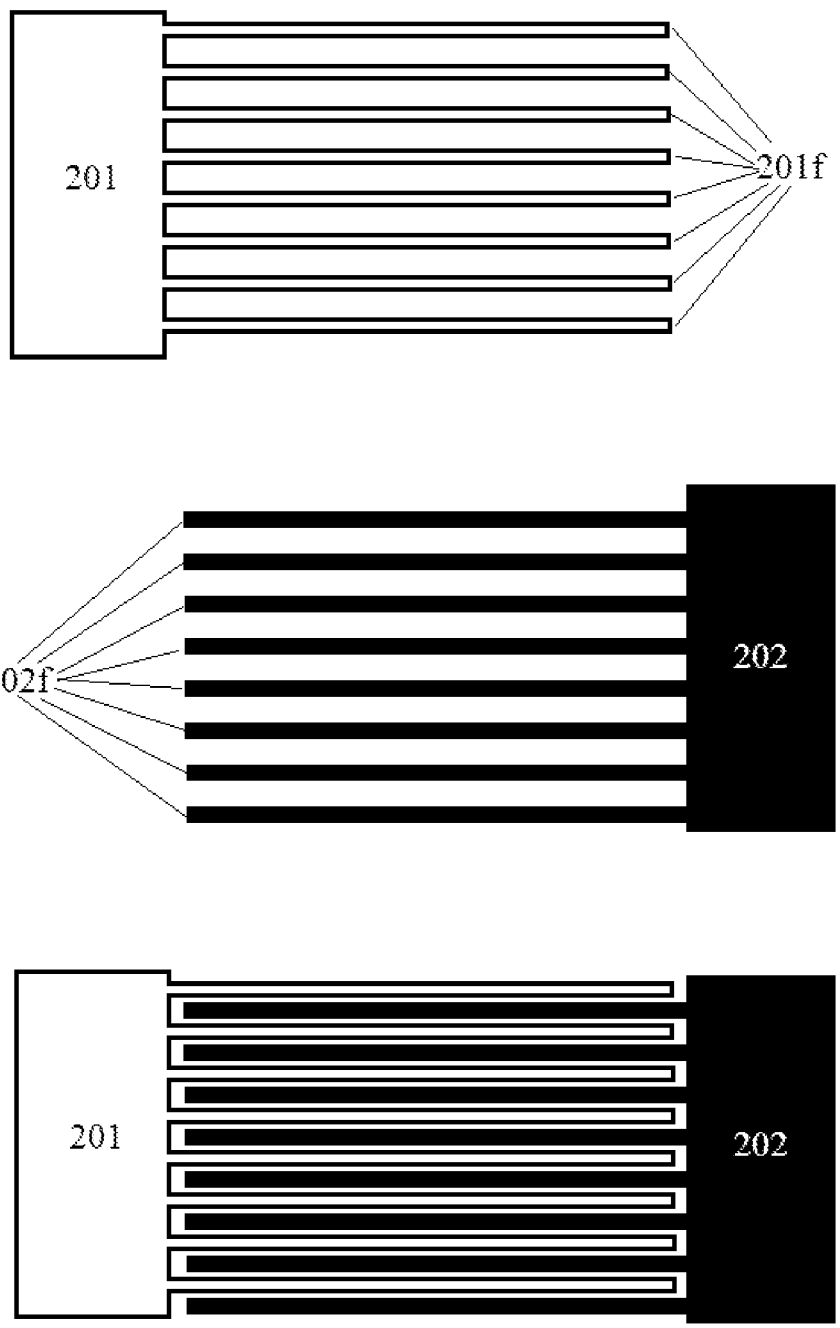
FIG. 6 illustrates the first/second electrical conductors having a comb finger configuration in accordance with an exemplary embodiment of the present invention.

In an embodiment as shown in FIG. 6, the first electrical conductor 201 may be so fabricated that it comprises a first set of comb fingers 201f. The movable membrane as second conductor 202 may be so fabricated that it comprises a second set of comb fingers 202f around the peripheral region of the membrane. The two sets of comb fingers 201f and 202f may be so fabricated that they are interleaved into each other. The second set of comb fingers 202f is movable along the primary direction (which is perpendicular to the membrane plane 202) relative to the first set of comb fingers 201f. As such, the resistance from air located within the gap between the membrane 202 and the substrate is lowered; for example, 25 times lower squeeze film damping.

Figure 7:
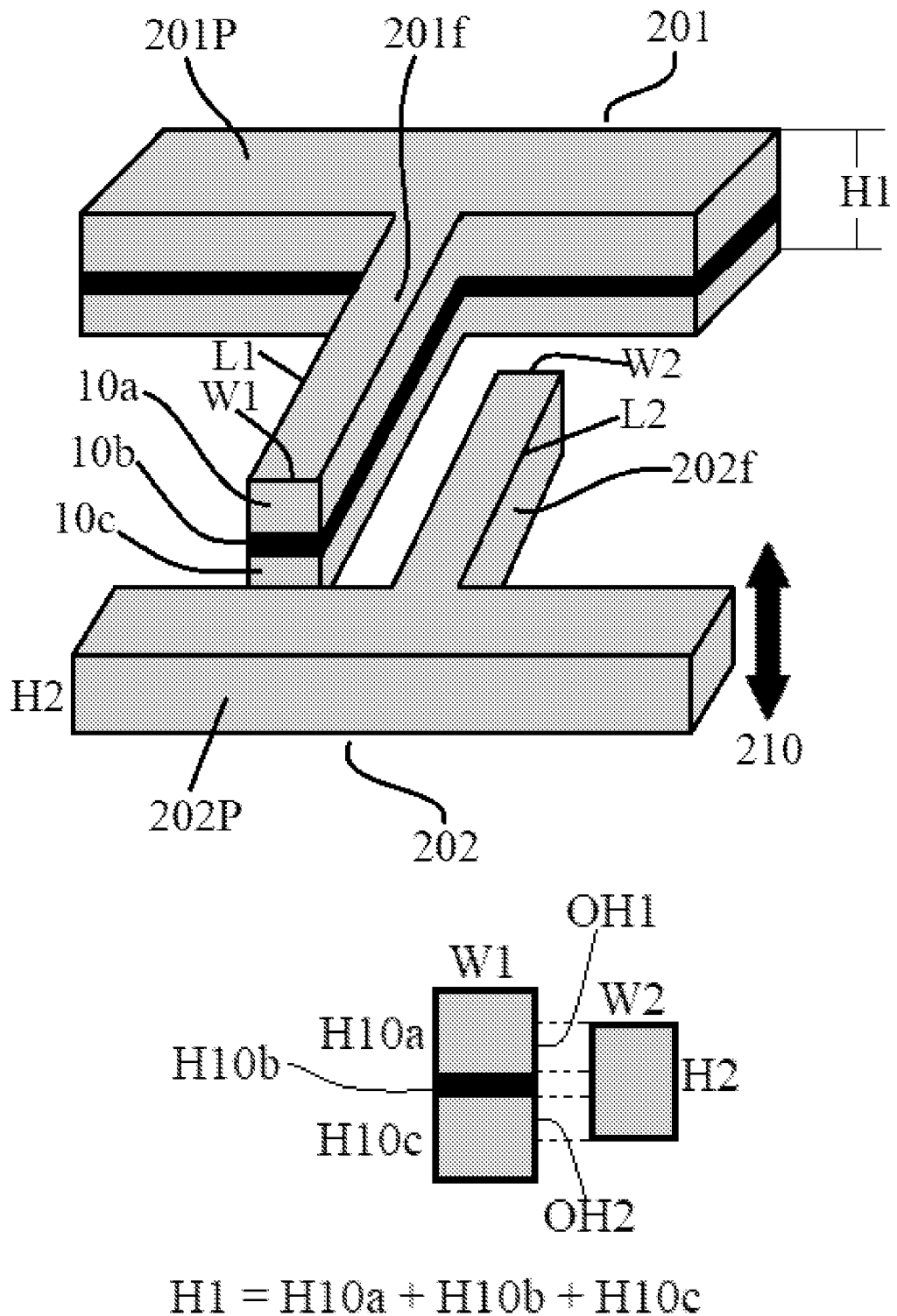
FIG. 7 depicts a specific spatial relationship between the two comb fingers of FIG. 6 in accordance with an exemplary embodiment of the present invention.

In various embodiments, the first set of comb fingers 201f and the second set of comb fingers 202f may be so fabricated that the entire height of the second set of comb fingers 202f overlaps a continuous height including the entire height of said electrical insulator 10b, a bottom one third of the entire height of the sub-conductor 10a above the electrical insulator 10b, and a top one third of an entire height of the sub-conductor 10c below the electrical insulator 10b. Please note all the heights herein are measured along the primary direction 210. In a preferred embodiment as shown in FIG. 7, each comb finger in the first set of comb fingers 201f and the second set of comb fingers 202f may be so fabricated that it has a long and thin rectangular shape. Each comb finger 201f has a width W1, a length L1 as measured from the comb palm 201P, and a height H1 as measured along the primary direction 210. Likewise, each comb finger 202f has a width W2, a length L2 as measured from the comb palm 202P, and a height H2 as measured along the primary direction 210. Two sub-conductors (10a, 10c) and electrical insulator 10b have heights H10a, H10c and H10b respectively, as measured along the primary direction 210. H1=H10a+H10c+H10b. The height OH1 (as measured along the primary direction 210) of the overlapped area between finger 202f and sub-conductors 10a is approximately the same as that between finger 202f and sub-conductors 10c (OH2) in the absence of an acoustic pressure impacting upon the two electrical conductors (or combs) 201 and 202. For example, OH1 may be between 0.9×OH2 and 1.1×OH2. In a specific embodiment, W1≈W2, L1≈L2, H1>H2, H10a≈H10c, OH1≈OH2, OH1≈⅓×H10a, and OH2≈⅓×H10c. The symbol "≈" may be equivalent to "=" with a 5% deviation.

Figure 8:
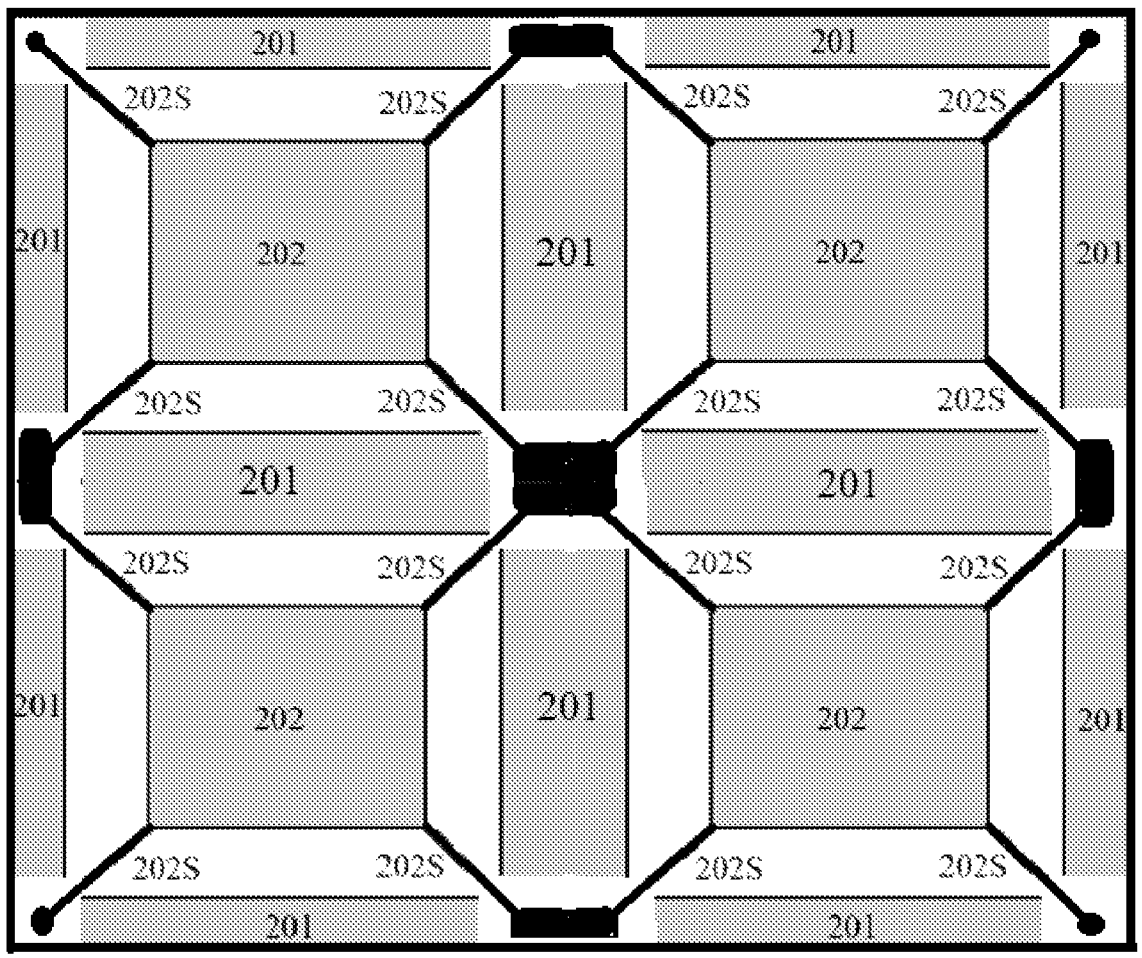
FIG. 8 shows that four movable membranes are arranged in a 2×2 array configuration in accordance with an exemplary embodiment of the present invention.

In exemplary embodiments, the movable membrane 202 may be so fabricated that it has a shape of square in a top view. As shown in the top view of FIG. 8, the capacitive microphone of the invention may be so fabricated that it includes one or more movable membranes. For example, four movable membranes can be fabricated and arranged in a 2×2 array configuration.

Figure 9:
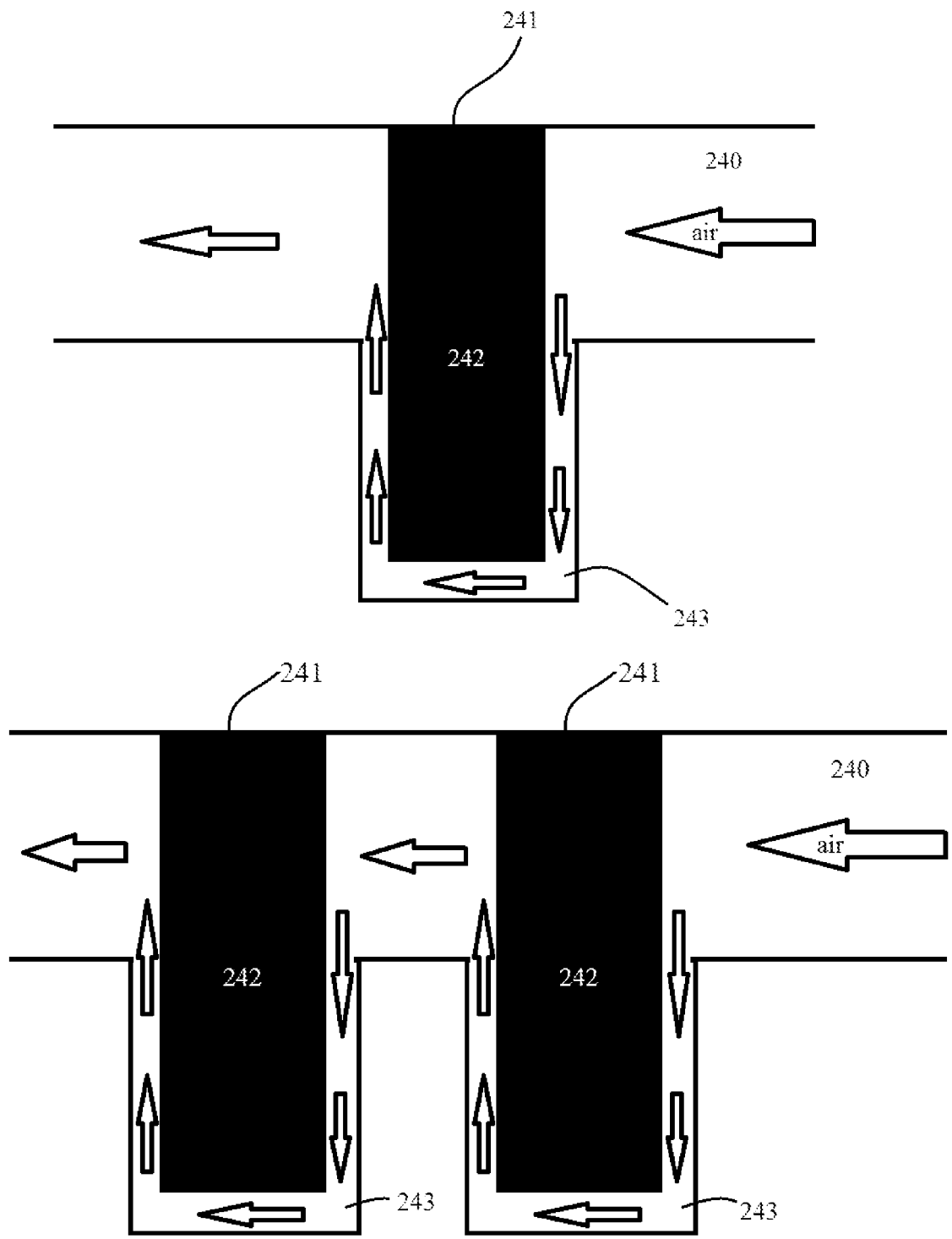
FIG. 9 demonstrates the design of one or more such as two air flow restrictors in accordance with an exemplary embodiment of the present invention.

In some embodiments as shown in FIG. 9, the capacitive microphone of the invention may be so fabricated that it comprises one or more such as two air flow restrictors 241 that restrict the flow rate of air that flows in/out of the gap between the membrane 202 and the substrate 230. Air flow restrictors 241 may be so fabricated that it can decrease the size of an air channel 240 for the air to flow in/out of the gap. Alternatively or additionally, air flow restrictors 241 may be so fabricated that it can increase the length of the air channel 240 for the air to flow in/out of the gap. For example, air flow restrictors 241 may be so fabricated that it comprises an insert 242 into a groove 243, which not only decreases the size of an air channel 240, but also increases the length of the air channel 240.

Referring back to FIGS. 6 and 7, comb fingers 201f are fixed relative to the substrate 230, and comb fingers 202f are integrated with membrane-shaped second electrical conductor 202 (hereinafter membrane 202 for simplicity). When membrane 202 vibrates due to sound wave, fingers 202f move together with membrane 202. The overlap areas (OA1 and OA2) between two neighboring fingers 201f and 202f will change along with this movement, and so do the capacitance therebetween. Eventually, two capacitance change signals (ΔMC1 and ΔMC2) are detected and are processed to provide the final output, as in a conventional capacitive microphone.

Figure 10:
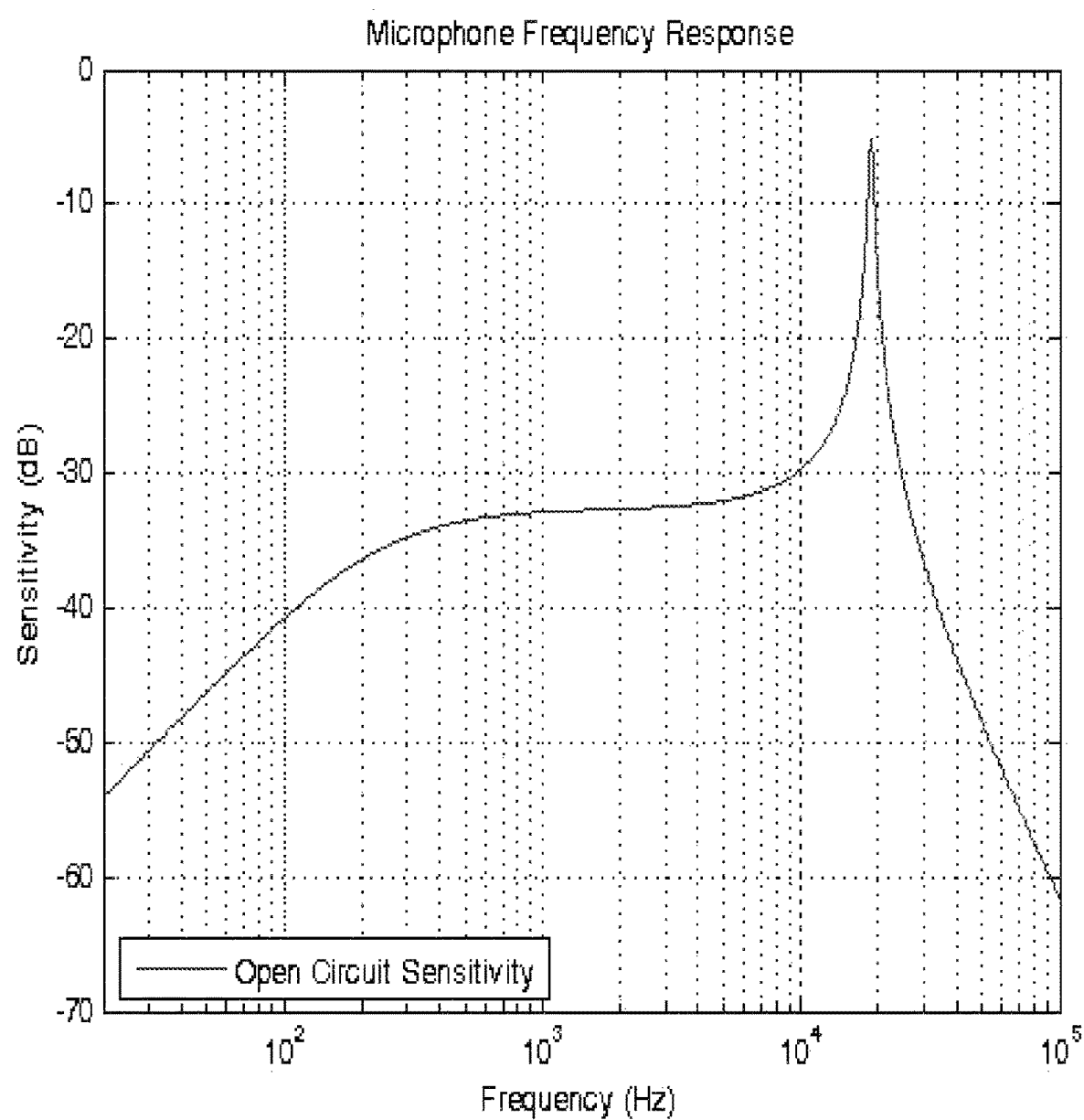
FIG. 10 shows that microphone sensitivity drops at low frequency due to air leakage.

Leakage is always a critical issue in microphone design. In conventional parallel plate design as shown in FIG. 1A, it typically has a couple of tiny holes around the edge in order to let air go through slowly, to keep air pressure balance on both sides of membrane 101 in low frequency. That is a desired leakage. However, a large leakage is undesired, because it will let some low frequency sound wave escape away from membrane vibration easily via the holes, and will result in a sensitivity drop in low frequency. FIG. 10 shows that sensitivity drops at low frequency due to leakage. For a typical capacitive MEMS microphone, the frequency range is between 100 Hz and 20 kHz, thus the sensitivity drop in FIG. 10 is undesired.

Figure 11:
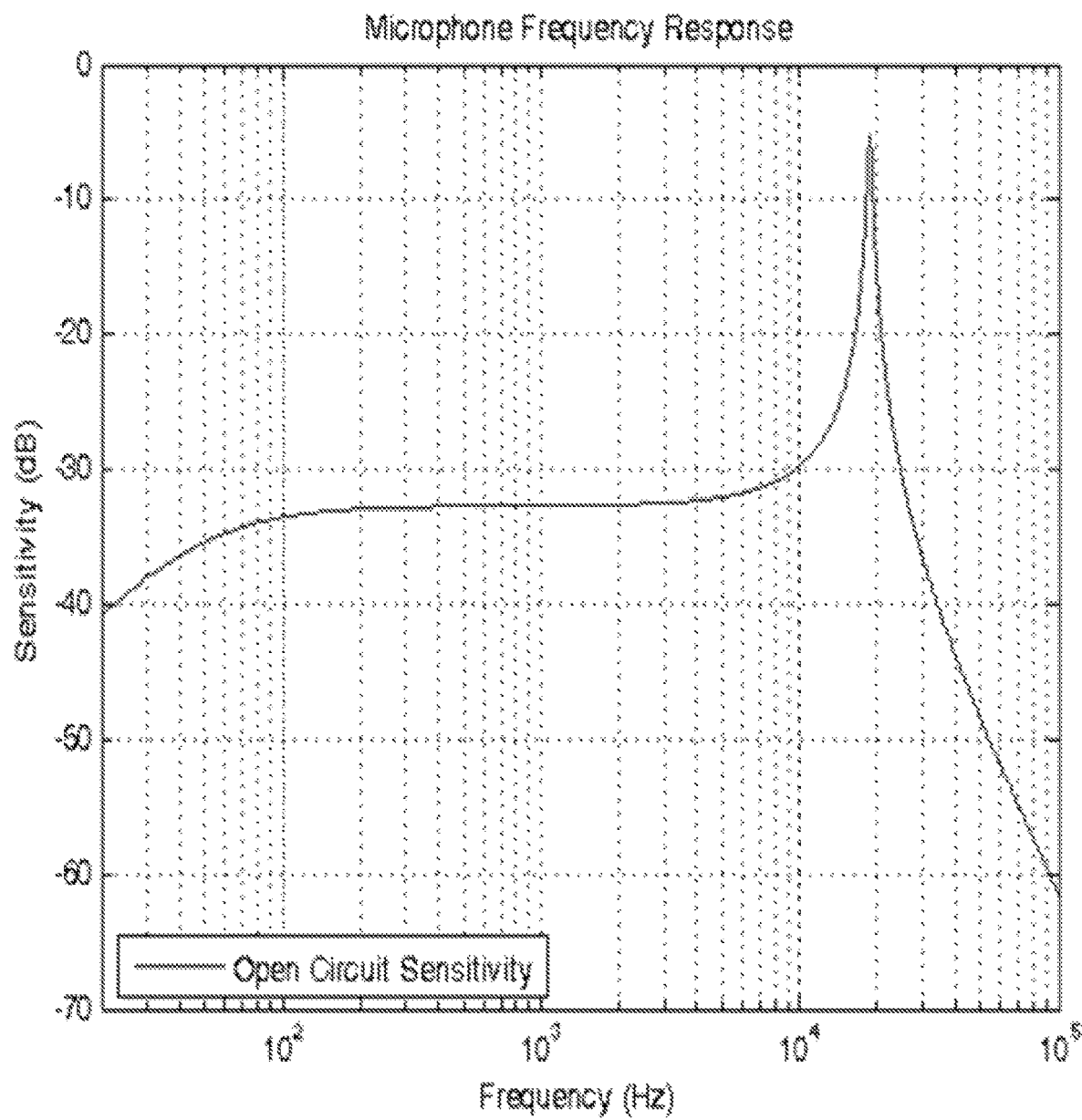
FIG. 11 shows the frequency response with air leakage reduced/prevented in accordance with an exemplary embodiment of the present invention.

In order to prevent this large leakage, a more preferred structure may be fabricated, as shown in FIG. 9, which illustrates a leakage prevent groove or slot and wall. Referring to FIG. 9, air flow restrictors 241 may be so fabricated that it functions as a structure for preventing air leakage in the microphone of the invention. Air flow restrictor 241 may be so fabricated that it comprises an insert 242 into a groove 243, which not only decreases the size of an air channel 240, but also increases the length of the air channel 240. In MEMS microphones, a deep slot may be etched on substrate around the edge of square membrane 202 and then a wall 242 connected to membrane 202 is deposited to form a long and narrow air tube 240, which gives a large acoustic resistance. FIG. 11 depicts the frequency response with leakage prevented. This leakage prevention structure has a significant effect on keeping the frequency response plot flatter on the range 100 Hz to 1000 Hz. The level of the air resistance may be controlled by the slot depth etched on the substrate. The deeper slot, the higher the resistance.

In various embodiments of the invention, the process for fabricating the lateral microphone as described above includes the following steps: (A10) providing a substrate having a planar surface, wherein a primary direction is defined as a direction perpendicular to the planar surface; (B10) depositing at least one removable layer such as a sacrificial layer on the planar surface; (C10) depositing one electrically conductive layer on said at least one removable layer; (D10) dividing the electrically conductive layer into two divided layers, both of which remain in contact with said at least one removable layer and are parallel with the planar surface; and (E10) etching away said at least one removable layer to form a capacitive microphone.

The substrate in the process may be made of silicon. The removable layer may comprise PSG or thermal oxide such as oxides of Si. The electrically conductive layer may comprise polysilicon, silicon, gold, silver, nickel, aluminum, copper, chromium, titanium, tungsten, or platinum. In step (D10), the electrically conductive layer may be divided or cut (e.g. by patterning and etching) into two divided layers, both of which remain in contact with said at least one removable layer. Both layers are substantially parallel to the planar surface. In step (E10), the removable layer is removed or etched away to form a capacitive microphone. In steps (D10) and (E10), the two divided layers become a first electrical conductor and a second electrical conductor in the capacitive microphone. In preferred embodiments, step (D10) may include cutting a first set of comb fingers in the first electrical conductor, and cutting a second set of comb fingers around a peripheral region of the movable membrane.

In exemplary embodiments of the invention, the lateral microphone may be a MEMS (Microelectromechanical System) microphone, AKA chip/silicon microphone. Typically, a pressure-sensitive diaphragm is etched directly into a silicon wafer by MEMS processing techniques, and is usually accompanied with integrated preamplifier. For a digital MEMS microphone, it may include built in analog-to-digital converter (ADC) circuits on the same CMOS chip making the chip a digital microphone and so more readily integrated with digital products.

Figure 12A:
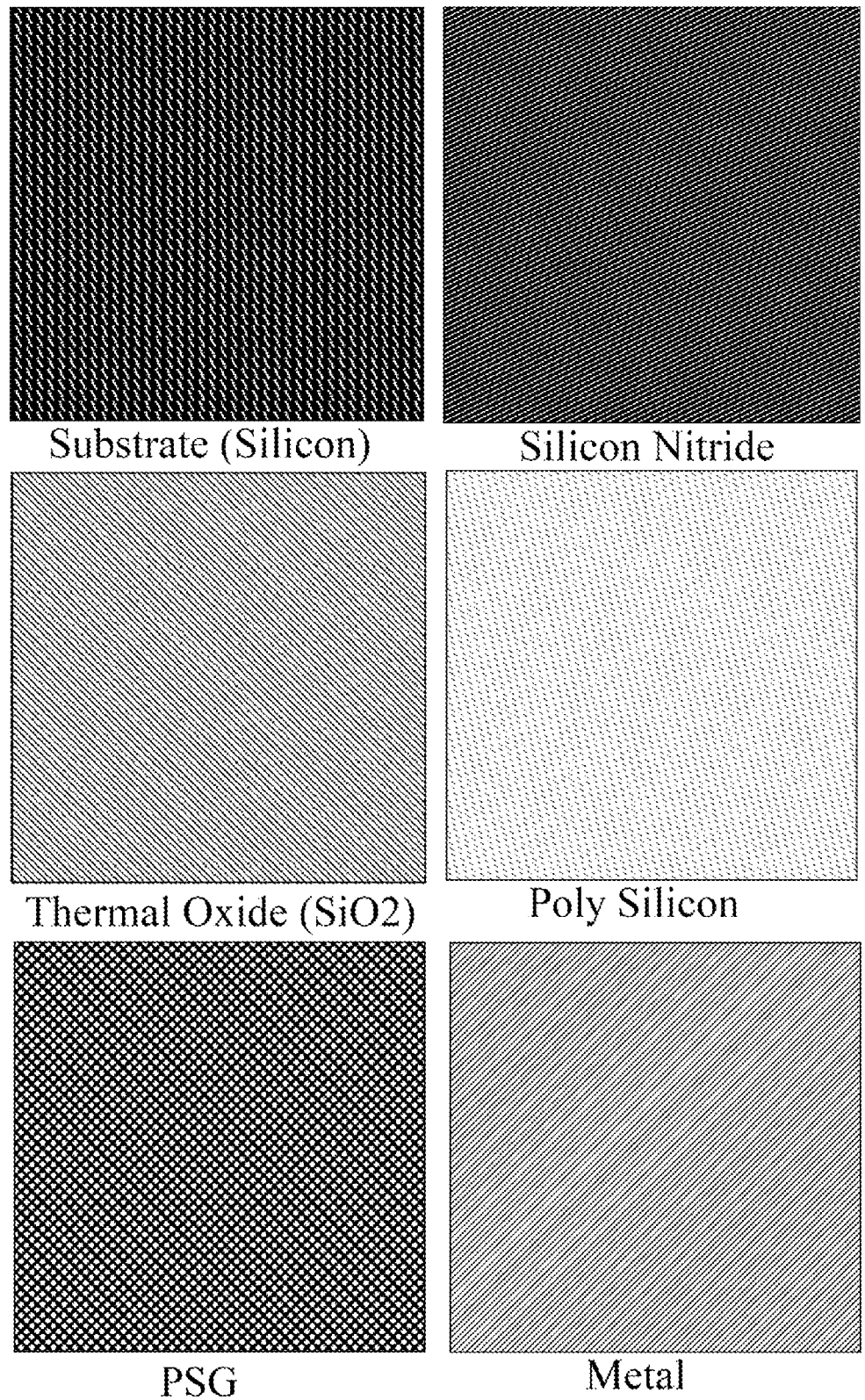
FIG. 12A shows texture representations or symbols of six different materials used in an exemplary fabrication process of the invention.

In the following FIGS. 12A-41, an exemplary process for making the capacitive microphone of the invention will be illustrated and described in more details. Six different materials are used in the fabrication process: substrate 230 (silicon), thermal oxide (e.g. silicon dioxide), poly silicon for 201 (except 10b), 202 and 242, phosphosilicate glass (PSG), silicon nitride for 10b, and metal. The texture representations or symbols of the six different materials are illustrated in FIG. 12A.

Figure 12B:
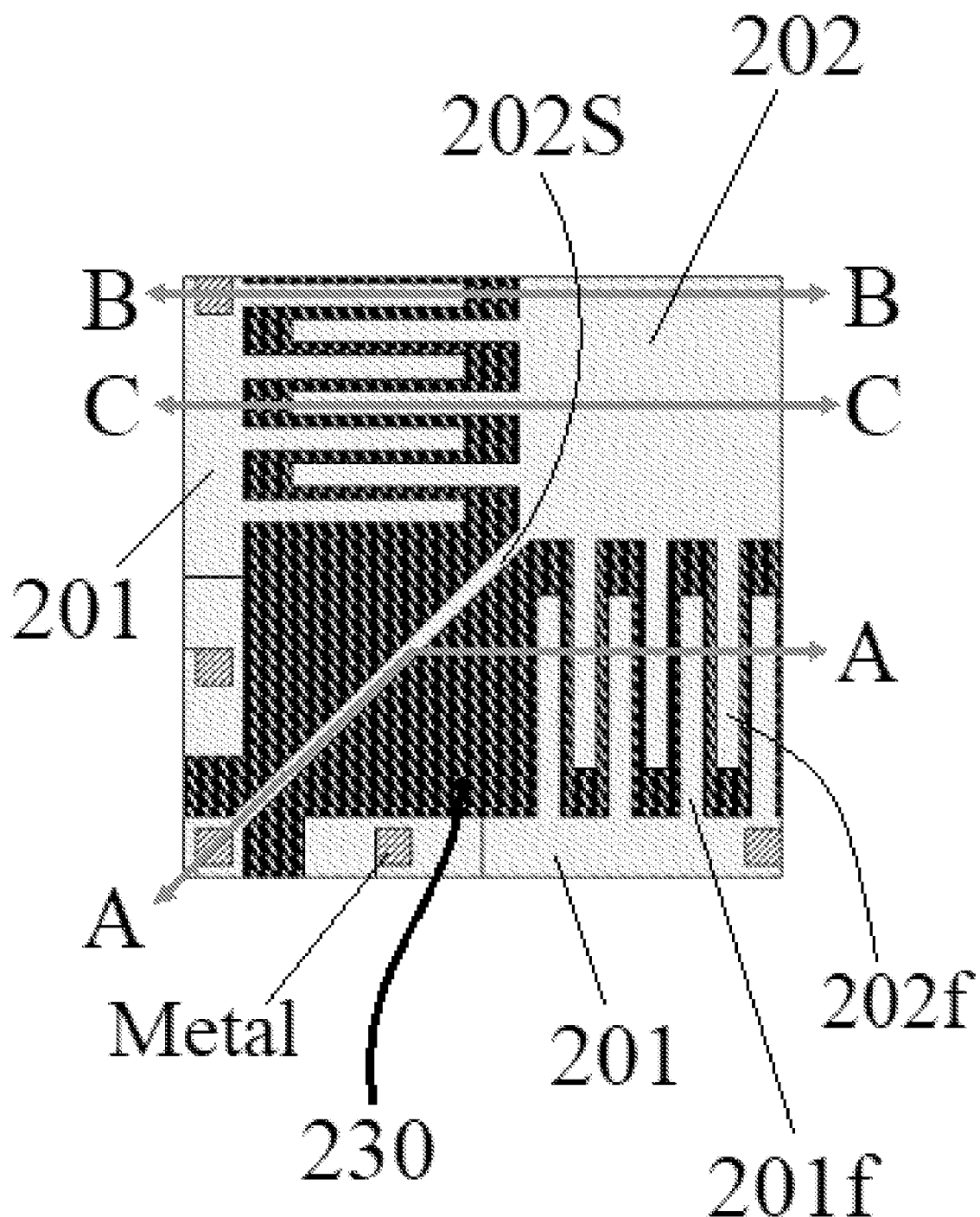
FIG. 12B illustrates a final microphone product prepared from the process.
Figure 13:
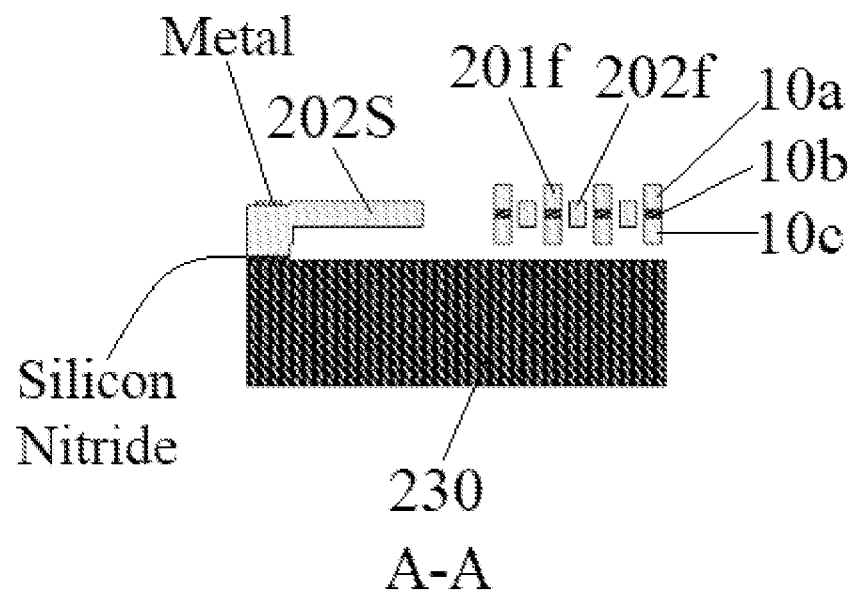
FIG. 13 is a cross-sectional view of the microphone of FIG. 12.
Figure 14:
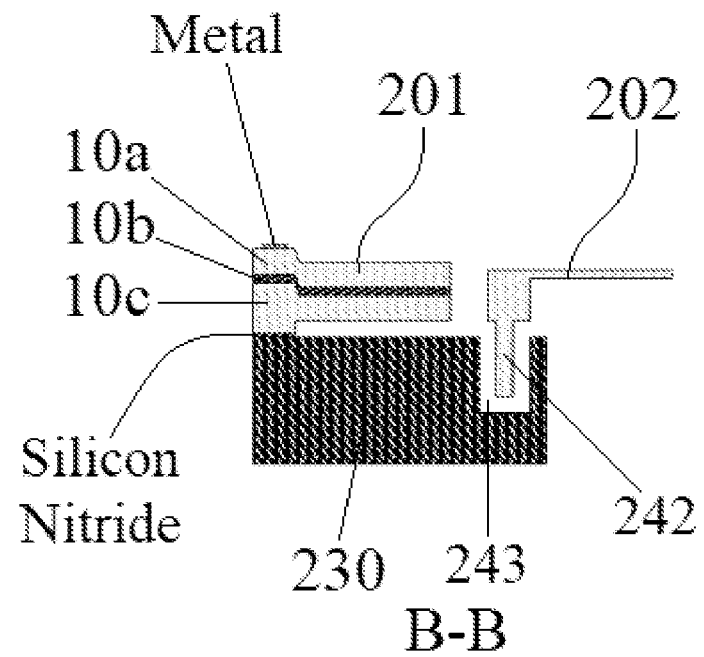
FIG. 14 is another cross-sectional view of the microphone of FIG. 12.
Figure 15:
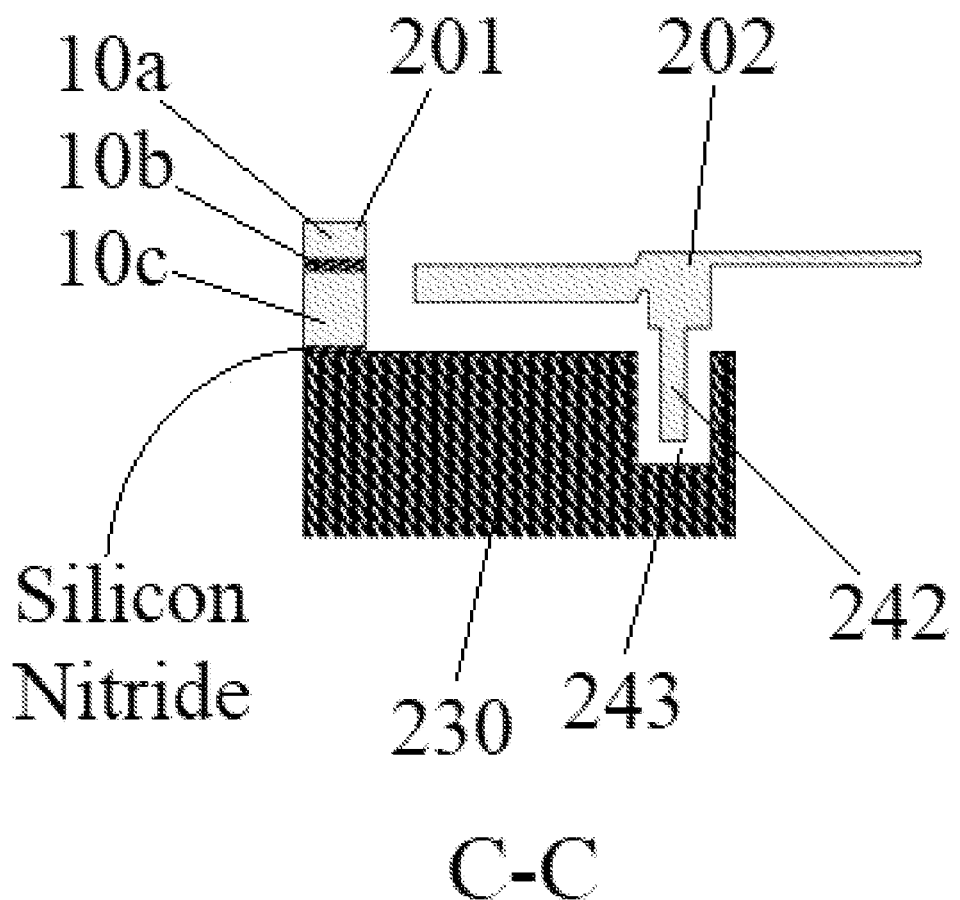
FIG. 15 is still another cross-sectional view of the microphone of FIG. 12.

The process according to the invention will fabricate a final microphone product as shown in FIG. 12B, which is the top view (in parallel with x-y plane and perpendicular to z axis) of the capacitive microphone (only a quarter thereof for simplicity). Referring to FIG. 12B, lines A-A, B-B and C-C represent different cross-sectional planes. FIG. 13 is the cross-sectional view of the microphone of FIG. 12 along the cutting planes A-A (hereinafter "View A-A" for short). FIG. 14 is the cross-sectional view of the microphone of FIG. 12 along the plane B-B (hereinafter "View B-B" for short). FIG. 15 is the cross-sectional view of the microphone of FIG. 12 along the plane C-C (hereinafter "View C-C" for short). Since line A-A has a turning point, it consists of two line-segments. Therefore, the cross-sectional view along planes A-A in FIG. 13 should be appreciated as the combined cross-sectional views from cutting along two planes or plane-segments, projected on x-z plane.

Views A-A, B-B and C-C are the same in each one of steps 1-8. The process starts with step 1 as shown in FIG. 16, providing a homogeneous substrate 230 having a planar surface. Step 2 as shown in FIG. 17 is depositing an isolation layer (e.g. 1 μm silicon nitride) onto the planar surface of substrate 230. Step 3 as shown in FIG. 18 is etching and patterning the isolation layer (silicon nitride). Step 4 as shown in FIG. 19 is etching and patterning (e.g. deep reactive ion etching (DRIE)) on the substrate 230 to form a trench 243 thereinto. The top view of the intermediate product from this step includes an exposed silicon nitride area and an exposed "trenched" substrate area. Step 5 as shown in FIG. 20 is thermal oxidation, in which thermal oxide of e.g. 2 μm thickness (a removable layer) is grew or deposited on the exposed "trenched" substrate area 230, but not on the exposed silicon nitride area. Step 6 as shown in FIG. 21 is depositing a poly silicon layer over both the silicon nitride area and the thermal oxide area. The insert 242 may be formed and extended into the trench 243 at this step. Step 7 as shown in FIG. 22 is etching and patterning the poly silicon layer. The top view of the intermediate product from this step includes two exposed poly silicon areas and an exposed thermal oxide area. Step 8 as shown in FIG. 23 is depositing a PSG layer (a removable layer) on both poly silicon areas and exposed thermal oxide area.

Views A-A, B-B and C-C are different from each other in each one of steps 9-26. Step 9 as shown in FIG. 24 is etching and patterning the PSG layer (a removable layer). Step 10 as shown in FIG. 25 is depositing a poly silicon layer. Step 11 as shown in FIG. 26 is etching and patterning the poly silicon layer. Step 12 as shown in FIG. 27 is depositing a PSG layer. Step 13 as shown in FIG. 28 is etching and patterning the PSG layer. Step 14 as shown in FIG. 29 is depositing a poly silicon layer. Step 15 as shown in FIG. 30 is depositing a silicon nitride layer. Step 16 as shown in FIG. 31 is depositing a poly silicon layer again. Step 17 as shown in FIG. 32 is etching and patterning the poly silicon layer deposited at step 16. Step 18 as shown in FIG. 33 is removing the exposed silicon nitride area. Step 19 as shown in FIG. 34 is depositing a metal layer for pad material. Step 20 as shown in FIG. 35 is etching and patterning pads. Step 21 as shown in FIG. 36 is etching and patterning the exposed poly silicon area. Step 22 as shown in FIG. 37 is etching and patterning the exposed silicon nitride area. Step 23 as shown in FIG. 38 is etching and patterning the exposed poly silicon area. Step 24 as shown in FIG. 39 is removing the exposed silicon nitride area.

Step 25 as shown in FIG. 40 is forming a cavity on the backside of the substrate, e.g. etching back hole or cavity using bulk fabrication. This step may provide access to (or expose) sacrificial materials or removable materials such as thermal oxide and PSG for further processing. Step 26 as shown in FIG. 41 is releasing, for example, removing the remaining thermal oxide and PSG materials. Wet etching technique may be used to remove all sacrificial materials or removable materials to release the microphone product. The device as shown in FIG. 41 is the same as the final product as shown in FIGS. 12B, 13, 14 and 15.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A process of fabricating a lateral-mode capacitive microphone comprising:
(A) fabricating a first electrical conductor and a second electrical conductor side by side over a substrate in a lateral-mode configuration,
wherein step (A) comprises (A-1) dividing one of the two electrical conductors into two sub-conductors; and (A-2) sandwiching an electrical insulator between the two sub-conductors, so that mutual capacitance between the two electrical conductors consists of two sub-capacitances generated between another one of the two electrical conductors and the two sub-conductors; and
wherein the lateral-mode configuration is defined as that the first electrical conductor and the second electrical conductor are configured to have a relative spatial relationship therebetween, and wherein a mutual capacitance (MC) can be generated between the first electrical conductor and the second electrical conductor;
wherein said relative spatial relationship and said mutual capacitance can both be varied by an acoustic pressure impacting upon the first electrical conductor and/or the second electrical conductor along a range of impacting directions in 3D space;
wherein said mutual capacitance is varied the most by an acoustic pressure impacting upon the first electrical conductor and/or the second electrical conductor along one direction among said range of impacting directions, said one direction being defined as the primary direction;

wherein the first electrical conductor has a first projection on a conceptual plane that is perpendicular to said primary direction;

wherein the second electrical conductor has a second projection on the conceptual plane;

wherein the first projection and the second projection have a shortest distance Dmin therebetween, and Dmin remains greater than zero regardless of that the first electrical conductor and/or the second electrical conductor is (are) impacted by an acoustic pressure along said primary direction or not;

wherein the process further comprises a step (Pre-A) before step (A), providing a substrate, wherein the substrate can be viewed as said conceptual plane, and wherein the first electrical conductor and the second electrical conductor are to be constructed above the substrate side-by-side during step (A);

wherein step (A) comprises:

fixing the first electrical conductor relative to the substrate; wherein the first electrical conductor includes said electrical insulator sandwiched between said two sub-conductors; and fabricating the second electrical conductor so that it comprises a membrane that is movable relative to the substrate; and wherein said primary direction is perpendicular to the membrane plane;

wherein step (A) comprises fabricating the two electrical conductors so that the first electrical conductor comprises a first set of comb fingers, the movable membrane comprises a second set of comb fingers around the peripheral region of the membrane, and the two sets of comb fingers are interleaved into each other; and wherein the process further comprises fabricating the two sets of comb fingers so that the first set of comb fingers and the second set of comb fingers are so configured that an entire height of the second set of comb fingers overlaps a continuous height including an entire height of said electrical insulator, a bottom one third of an entire height of the sub-conductor above the electrical insulator, and a top one third of an entire height of the sub-conductor below the electrical insulator; wherein all the heights are measured along the primary direction.

2. The process according to claim 1, wherein step (A-1) comprises fabricating the two sub-conductors so that the two sub-capacitances are MC1 and MC2; MC=MC1+MC2; MC1=45~55% MC; and MC2=55~45% MC, in the absence of an acoustic pressure impacting upon the two electrical conductors.

3. The process according to claim 1, wherein step (A-2) comprises stacking the electrical insulator and the two sub-conductors over each other along the primary direction and forming a three-layer "sandwich" structure.

4. The process according to claim 1, wherein said electrical insulator is made of silicon nitride; and wherein said another one of the two electrical conductors and the two sub-conductors are independently of each other made of polysilicon, gold, silver, nickel, aluminum, copper, chromium, titanium, tungsten, or platinum.

5. The process according to claim 1, which is used for fabricating a MEMS microphone.

6. The process according to claim 1, wherein step (A) comprises attaching the movable membrane to the substrate via three or more suspensions.

7. The process according to claim 6, comprising fabricating the suspension so that it comprises folded and symmetrical cantilevers.

8. The process according to claim 1, comprising fabricating the two sets of comb fingers so that the second set of comb fingers are laterally movable relative to the first set of comb fingers, and the resistance from air located within the gap between the membrane and the substrate is lowered.

9. The process according to claim 1, comprising fabricating the movable membrane into a square shape from a top view.

10. The process according to claim 9, comprising fabricating one or more of said movable membranes.

11. The process according to claim 10, comprising fabricating four movable membranes arranged in a 2×2 array configuration.

12. A process of fabricating a lateral-mode capacitive microphone comprising:

(A) fabricating a first electrical conductor and a second electrical conductor side by side over a substrate in a lateral-mode configuration, wherein step (A) comprises (A-1) dividing one of the two electrical conductors into two sub-conductors; and (A-2) sandwiching an electrical insulator between the two sub-conductors, so that mutual capacitance between the two electrical conductors consists of two sub-capacitances generated between another one of the two electrical conductors and the two sub-conductors; and wherein the lateral-mode configuration is defined as that the first electrical conductor and the second electrical conductor are configured to have a relative spatial relationship therebetween, and wherein a mutual capacitance (MC) can be generated between the first electrical conductor and the second electrical conductor;

wherein said relative spatial relationship and said mutual capacitance can both be varied by an acoustic pressure impacting upon the first electrical conductor and/or the second electrical conductor along a range of impacting directions in 3D space;

wherein said mutual capacitance is varied the most by an acoustic pressure impacting upon the first electrical conductor and/or the second electrical conductor along one direction among said range of impacting directions, said one direction being defined as the primary direction;

wherein the first electrical conductor has a first projection on a conceptual plane that is perpendicular to said primary direction;

wherein the second electrical conductor has a second projection on the conceptual plane;

wherein the first projection and the second projection have a shortest distance Dmin therebetween, and Dmin remains greater than zero regardless of that the first electrical conductor and/or the second electrical conductor is (are) impacted by an acoustic pressure along said primary direction or not;

wherein the process further comprises a step (Pre-A) before step (A), providing a substrate, wherein the substrate can be viewed as said conceptual plane, and wherein the first electrical conductor and the second electrical conductor are to be constructed above the substrate side-by-side during step (A);

wherein step (A) comprises:
fixing the first electrical conductor relative to the substrate; wherein the first electrical conductor includes said electrical insulator sandwiched between said two sub-conductors; and
fabricating the second electrical conductor so that it comprises a membrane that is movable relative to the substrate; and wherein said primary direction is perpendicular to the membrane plane; and
wherein the process further comprises fabricating an air flow restrictor that restricts the flow rate of air that flows in/out of the gap between the membrane and the substrate.

13. The process according to claim 12, wherein the air flow restrictor decreases the size of an air channel for the air to flow in/out of the gap between the membrane and the substrate.

14. The process according to claim 12, wherein the air flow restrictor increases the length of an air channel for the air to flow in/out of the gap between the membrane and the substrate.

15. The process according to claim 12, comprising fabricating the air flow restrictor so that it comprises an insert into a groove.

16. The process according to claim 1, comprising fabricating at least two air flow restrictors that restrict the flow rate of air that flows in/out of the gap between the membrane and the substrate.

* * * * *